US011108323B2

(12) United States Patent
Tsukuda et al.

(10) Patent No.: US 11,108,323 B2
(45) Date of Patent: Aug. 31, 2021

(54) VOLTAGE CONVERSION CIRCUIT, SOLID-STATE IMAGING ELEMENT, AND METHOD OF CONTROLLING VOLTAGE CONVERSION CIRCUIT

(71) Applicant: SONY SEMICONDUCTOR SOLUTIONS CORPORATION, Kanagawa (JP)

(72) Inventors: Yasunori Tsukuda, Kanagawa (JP); Kazutoshi Tomita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/759,534

(22) PCT Filed: Sep. 18, 2018

(86) PCT No.: PCT/JP2018/034436
§ 371 (c)(1),
(2) Date: Apr. 27, 2020

(87) PCT Pub. No.: WO2019/087597
PCT Pub. Date: May 9, 2019

(65) Prior Publication Data
US 2020/0280255 A1    Sep. 3, 2020

(30) Foreign Application Priority Data
Nov. 6, 2017    (JP) .............................. JP2017-213435

(51) Int. Cl.
*H02M 3/156* (2006.01)
*H01L 27/146* (2006.01)
(Continued)

(52) U.S. Cl.
CPC ...... *H02M 3/156* (2013.01); *H01L 27/14612* (2013.01); *H01L 27/14643* (2013.01);
(Continued)

(58) Field of Classification Search
None
See application file for complete search history.

(56) References Cited

U.S. PATENT DOCUMENTS 5,557,221 A   9/1996  Taguchi et al.
5,570,044 A   10/1996 Martin et al.
(Continued)

FOREIGN PATENT DOCUMENTS

| CN | 101828367 A | 9/2010 |
|----|-------------|--------|
| CN | 105789231 A | 7/2016 |

(Continued)

OTHER PUBLICATIONS

International Search Report and Written Opinion of PCT Application No. PCT/JP2018/034436, dated Dec. 18, 2018, 11 pages of ISRWO.

*Primary Examiner* — Jany Richardson
(74) *Attorney, Agent, or Firm* — Chip Law Group

(57) ABSTRACT

Noise is reduced in a circuit that converts voltage. A voltage conversion circuit includes a conversion transistor, a current source transistor, and a control circuit. In this voltage conversion circuit, the conversion transistor converts a potential of an input signal, the potential being changed from one of two different potentials to the other, by using predetermined current, and outputs the converted signal as an output signal. Furthermore, the current source transistor supplies the predetermined current. Then, in a case where the potential of the input signal is changed to the other potential, the control circuit stops supplying the predetermined current.

14 Claims, 22 Drawing Sheets

(51) Int. Cl.
*H03K 19/003* (2006.01)
*H03K 19/0185* (2006.01)
*H04N 5/3745* (2011.01)
*H04N 5/376* (2011.01)

(52) U.S. Cl.
CPC ........... *H03K 19/00384* (2013.01); *H03K 19/018521* (2013.01); *H04N 5/3745* (2013.01); *H04N 5/3765* (2013.01)

(56) References Cited

U.S. PATENT DOCUMENTS

| | | |
|---|---|---|
| 5,812,121 A | 9/1998 | Hughes |
| 2008/0106299 A1* | 5/2008 | Oh ............... H03K 19/0016 326/33 |
| 2011/0210771 A1 | 9/2011 | Shinmyo |
| 2012/0056251 A1 | 3/2012 | Kudoh |
| 2015/0244372 A1* | 8/2015 | Purushothaman ................... H03K 19/0013 326/68 |
| 2017/0155865 A1 | 6/2017 | Nakajima et al. |

FOREIGN PATENT DOCUMENTS

| | | |
|---|---|---|
| CN | 106233465 A | 12/2016 |
| EP | 05755124 A2 | 12/1993 |
| EP | 0621693 A2 | 10/1994 |
| EP | 0670536 A1 | 9/1995 |
| EP | 2337286 A1 | 6/2011 |
| EP | 2426719 A2 | 3/2012 |
| JP | 04-037217 A | 2/1992 |
| JP | 06-104725 A | 4/1994 |
| JP | 06-326582 A | 11/1994 |
| JP | 07-303039 A | 11/1995 |
| JP | 2011-071753 A | 4/2011 |
| JP | 2012-054495 A | 3/2012 |
| JP | 2013-005196 A | 1/2013 |
| JP | 2013-110566 A | 6/2013 |
| KR | 10-2012-0024406 A | 3/2012 |
| KR | 10-2016-0144358 A | 12/2016 |
| WO | 2010/041352 A1 | 4/2010 |
| WO | 2015/159728 A1 | 10/2015 |

\* cited by examiner

|  | INITIAL STATE | BEFORE INVERSION | AFTER INVERSION |
|---|---|---|---|
| RESET SIGNAL RST | HIGH LEVEL | LOW LEVEL | |
| OUTPUT SIGNAL $COMP_L$ | LOW LEVEL | LOW LEVEL | HIGH LEVEL |
| CURRENT SOURCE TRANSISTOR | ON (CURRENT SUPPLIED) | ON (CURRENT SUPPLIED) | OFF (CURRENT CUT OFF) |

US 11,108,323 B2

VOLTAGE CONVERSION CIRCUIT, SOLID-STATE IMAGING ELEMENT, AND METHOD OF CONTROLLING VOLTAGE CONVERSION CIRCUIT

CROSS REFERENCE TO RELATED APPLICATIONS

This application is a U.S. National Phase of International Patent Application No. PCT/JP2018/034436 filed on Sep. 18, 2018, which claims priority benefit of Japanese Patent Application No. JP 2017-213435 filed in the Japan Patent Office on Nov. 6, 2017. Each of the above-referenced applications is hereby incorporated herein by reference in its entirety.

TECHNICAL FIELD

The present technology relates to a voltage conversion circuit, a solid-state imaging element, and a method of controlling the voltage conversion circuit. More specifically, the present technology relates to a voltage conversion circuit, a solid-state imaging element, and a method of controlling the voltage conversion circuit which are adapted to convert voltage of a signal from a comparator.

BACKGROUND ART

Conventionally, an analog to digital converter (ADC) has been used to convert an analog pixel signal into a digital signal in a solid-state imaging element or the like. There may be a case where a voltage conversion circuit that converts voltage is provided inside the ADC from a viewpoint of reducing power and mounting area. For example, there is a proposed voltage conversion circuit in which two stages of inverters are arranged (refer to, for example, Patent Document 1). Each of these inverters includes a p-channel metal-oxide-semiconductor (pMOS) transistor and an n-channel MOS (nMOS) transistor connected in series to a low-voltage power source. In this configuration, it is necessary to arrange a high breakdown voltage transistor having threshold voltage higher in a first-stage stage than that in a second stage because a high-voltage signal is received in the first-stage inverter.

CITATION LIST

Patent Document

Patent Document 1: Japanese Patent Application Laid-Open No. 04-37217

SUMMARY OF THE INVENTION

Problems to be Solved be the Invention

In related art described above, it is possible to convert voltage by two stages of inverters without changing a logical value of a signal. However, in a case where power source voltage on a low-voltage side is too low, there may be a case where gate-source voltage of a pMOS transistor of a first stage becomes less than threshold voltage and the pMOS transistor is not be shifted to an ON state when a low-level signal is received. Furthermore, there is a possibility that through current flows in the inverters when the signal is inverted, and a power source potential and a ground potential fluctuate because of this through current. Due to malfunction of these pMOS transistors and such fluctuation of the power source potential and the like, there is a possibility that instantaneous current called a glitch is caused when the signal is changed. When this instantaneous current flows to a resistor, noise is generated. The glitch (instantaneous current) can be suppressed by replacing the inverter with a source-grounded circuit including an nMOS transistor and a resistor, but there is a problem that current regularly flows from the power source and power consumption is increased when a signal comes to have a high level. Thus, in the above-described related art, it is difficult to reduce the noise caused by the glitch.

The present technology is created in the view of such a situation and directed to reducing noise in a circuit that converts voltage.

Solutions to Problems

The present technology is made to solve the above-described problems, and according to a first aspect thereof, provided are a voltage conversion circuit and a control method thereof, and the voltage conversion circuit includes: a conversion transistor that converts a potential of an input signal, the potential being changed from one of two different potentials to the other potential, by using predetermined current, and outputs the converted signal as an output signal; a current source transistor that supplies the predetermined current; and a control circuit that stops supplying the predetermined current in a case where the potential of the input signal is changed to the other potential. With this configuration, there is a functional effect that the current supply is stopped in the case where the potential of the input signal is changed.

Furthermore, in this first aspect, the above-described input signal is a signal having a potential changed from a higher potential out of two power source potentials different from each other to a reference potential that is lower than the two power source potentials, and the control circuit may stop supplying the predetermined current by a stop signal having a lower potential out of the two power source potentials. With this configuration, there is a functional effect that the potential of the input signal is lowered.

Furthermore, in this first aspect, the above-described conversion transistor may be an nMOS transistor, and the current source transistor may be a pMOS transistor having lower breakdown voltage than breakdown voltage of the nMOS transistor. With this configuration, there is a functional effect that the stop signal having the lower potential is received in the pMOS transistor having the low breakdown voltage.

Furthermore, in the first aspect, the above-described current source transistor supplies the predetermined current in an initial state, and in a case where a predetermined reset signal is received, the control circuit may shift the current source transistor to the initial state. With this configuration, there is a functional effect that the current source transistor is initialized by the reset signal.

Furthermore, in the first aspect, further provided may be an enable control transistor that operates the above-described conversion transistor in a case where a predetermined enable signal is received. With this configuration, there is a functional effect that the conversion operation is controlled by the enable signal.

Furthermore, in the first aspect, further provided may be a current control transistor that limits the above-described predetermined current to a value less than a predetermined value. With this configuration, there is a functional effect that the current is limited to the value less than the predetermined value.

Furthermore, in this first aspect, further provided may be: a capacitor inserted between a gate of the above-described current source transistor and a power source potential; a pair of pMOS transistors connected in series between the gate of the power source transistor and the power source potential; and a switch that supplies a predetermined bias potential to the gate of the current source transistor in a case where a predetermined reset signal is received, in which the reset signal may be received in one of gates of the pair of pSMOS transistors, and the other gate of the pair of pMOS transistors may be connected to a connection node between the current source transistor and the conversion transistor. With this configuration, there is a functional effect that the bias potential is supplied in a case where the reset signal is received.

Furthermore, according to a second aspect of the present technology, provided is a solid-state imaging element including: a comparator that compares a pixel signal with a predetermined reference signal and generates an input signal having a potential changed from one of two different potentials to the other potential on the basis of a result of the comparison; a conversion transistor that converts the above-described potential of the input signal by using predetermined current, and outputs the converted signal as an output signal; a current source transistor that supplies the predetermined current; and a control circuit that stops supplying the predetermined current in a case where the potential of the input signal is changed to the other potential. With this configuration, there is a functional effect that the current supply is stopped in a case where the potential of the input signal from the comparator is changed.

Furthermore, in the second aspect, the above-described comparator may be provided on a predetermined substrate, and the conversion transistor, the current source transistor, and the control circuit may be provided on a substrate different from the predetermined substrate. With this configuration, there is a functional effect that the comparator; and the conversion transistor, the current source transistor, and the control circuit are arranged in a manner distributed onto the two substrates.

Furthermore, in the second aspect, the above-described comparator and the conversion transistor may be provided on a predetermined substrate, and the current source transistor and the control circuit may be provided on a substrate different from the predetermined substrate. With this configuration, there is a functional effect that the comparator and the conversion transistor; and the current source transistor and the control circuit are arranged in a manner distributed onto the two substrates.

Furthermore, in the second aspect, further provided may be a pixel circuit that generates the pixel signal, the above-described pixel circuit may be provided on a predetermined substrate, the comparator, the conversion transistor, the current source transistor, and the control circuit may be provided on a substrate different from the predetermined substrate. With this configuration, there is a functional effect that the pixel circuit; and the comparator, the conversion transistor, the current source transistor, and the control circuit are arranged in a manner distributed onto the two substrates.

Furthermore, in the second aspect, further provided may be a pixel circuit that generates the above-described pixel signal, the pixel circuit may be provided on a first substrate, the comparator may be provided on a second substrate different from the first substrate, the conversion transistor, the current source transistor, and the control circuit may be provided on a third substrate different from the first and second substrates. With this configuration, there is a functional effect that the pixel circuit; the comparator; and the conversion transistor, the current source transistor, and the control circuit are arranged in a manner distributed onto the three substrates.

Furthermore, in the second aspect, further provided may be a pixel circuit that generates the above-described pixel signal, the pixel circuit may be provided on a first substrate, the comparator and the conversion transistor may be provided on a second substrate different from the first substrate, the current source transistor and the control circuit may be provided on a third substrate different from the first and second substrates. With this configuration, there is a functional effect that the pixel circuit; the comparator and the conversion transistor; and the current source transistor and the control circuit are arranged in a manner distributed onto the three substrates.

Effects of the Invention

According to the present technology, it is possible to provide an excellent effect that noise can be reduced in a circuit that converts voltage. Note that the effect recited herein is not necessarily limited and may be any one of the effects recited in the present disclosure.

MODE FOR CARRYING OUT THE INVENTION

In the following, modes to implement the present technology (hereinafter referred to as "embodiments") will be described. The description will be provided in the following order.

1. First Embodiment (Example in which current supply is stopped when a signal is inverted)
2. Second Embodiment (Example in which an enable signal is controlled to stop current supply when a signal is inverted)
3. Third Embodiment (Example in which current is limited to stop current supply when a signal is inverted)
4. Fourth embodiment (Example in which part of a voltage conversion circuit is arranged on an upper substrate, and current supply is stopped when a signal is inverted)
5. Fifth Embodiment (Example in which a comparison unit is arranged on a lower substrate, and current supply is stopped when a signal is inverted)
6. Sixth embodiment (Example in which a circuit is arranged in a manner distributed onto three substrates, and current supply is stopped when a signal is inverted)
7. Seventh Embodiment (Example in which part of a voltage conversion circuit is arranged on an intermediate substrate, and current supply is stopped when a signal is inverted)
8. Exemplary Application to Moving Object 1. First Embodiment

[Exemplary Configuration of Imaging Device]

Figure 1:
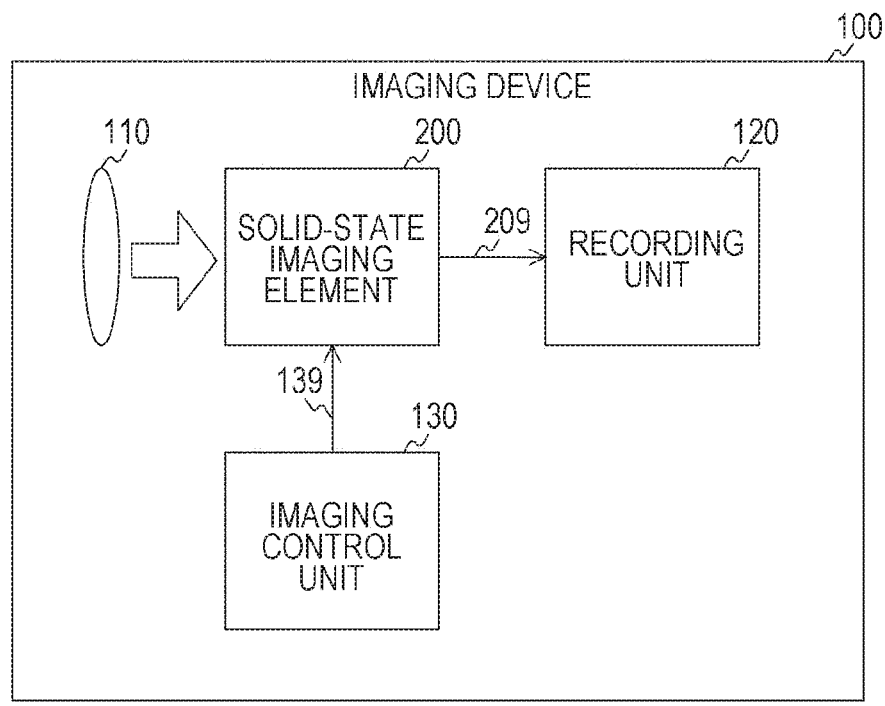
FIG. 1 is a block diagram illustrating an exemplary configuration of an imaging device according to a first embodiment of the present technology.

FIG. 1 is a block diagram illustrating an exemplary configuration of an imaging device 100 according to an embodiment of the present technology. The imaging device 100 includes an imaging lens 110, a solid-state imaging element 200, a recording unit 120, and an imaging control unit 130. As the imaging device 100, a smartphone, an internet of things (IoT) camera, an in-vehicle camera, or the like is assumed.

The imaging lens 110 collects incident light and guides the collected light to the solid-state imaging element 200. The solid-state imaging element 200 photoelectrically converts the incident light to capture image data. The solid-state imaging element 200 outputs the captured image data to the recording unit 120 via a signal line 209.

The recording unit 120 records the image data. The imaging control unit 130 controls the solid-state imaging element 200 via a signal line 139 to capture the image data.

[Exemplary Configuration of Solid-State Imaging Element]

Figure 2:
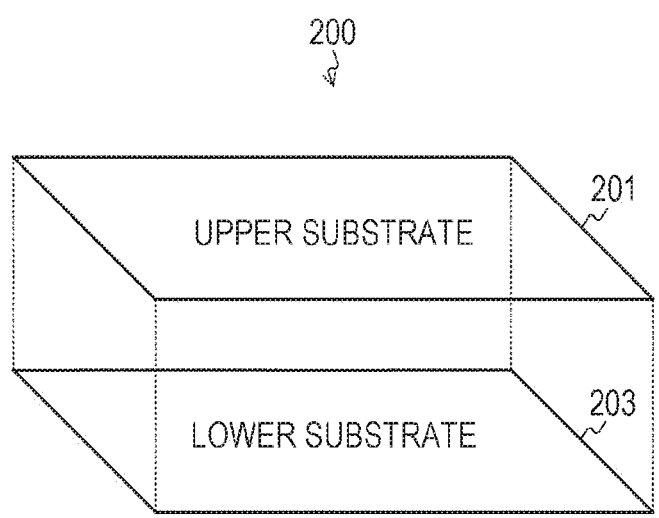
FIG. 2 is a view illustrating an exemplary laminated structure of a solid-state imaging element according to the first embodiment of the present technology.

FIG. 2 is a view illustrating an exemplary laminated structure of the solid-state imaging element 200 according to the first embodiment of the present technology. The solid-state imaging element 200 includes a lower substrate 203 and an upper substrate 201 laminated on the lower substrate 203. The upper substrate 201 is arranged above the lower substrate 203 while setting, as an upward direction, a direction from the substrate toward the imaging lens 110.

Figure 3:
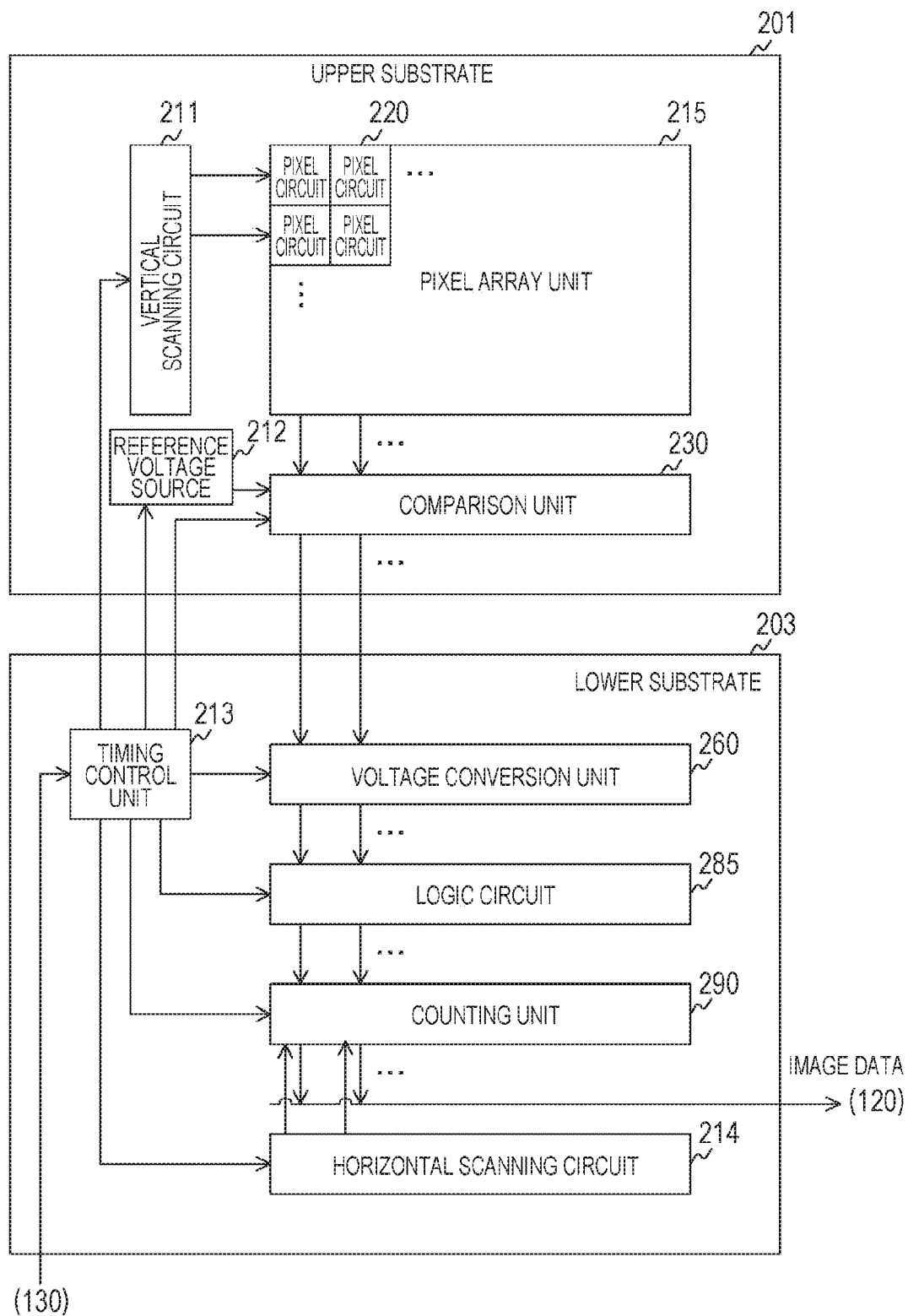
FIG. 3 is a block diagram illustrating an exemplary configuration of the solid-state imaging element according to the first embodiment of the present technology.

FIG. 3 is a block diagram illustrating an exemplary configuration of the solid-state imaging element 200 according to the first embodiment of the present technology. The upper substrate 201 includes a vertical scanning circuit 211, a reference voltage source 212, a pixel array unit 215, and a comparison unit 230. The lower substrate 203 includes a timing control unit 213, a voltage conversion unit 260, a logic circuit 285, a counting unit 290, and a horizontal scanning circuit 214.

The pixel array unit 215 has a plurality of pixel circuits 220 arranged in a two-dimensional lattice form. In the following, a set of the pixel circuits 220 arrayed in a predetermined direction (horizontal direction or the like) will be referred to as a "row", and a set of the pixel circuits 220 arrayed in a direction perpendicular to the row will be referred to as a "column".

The vertical scanning circuit 211 sequentially selects and drives the rows in accordance with control of the timing control unit 213. Each pixel circuit 220 photoelectrically converts incident light and generates an analog pixel signal. The pixel circuit 220 supplies the generated pixel signal to the comparison unit 230.

The reference voltage source 212 generates a predetermined reference signal by applying digital to analog (DA) conversion or the like to a control signal from the timing control unit 213, and supplies the reference signal to the comparison unit 230. As the reference signal, for example, a lamp signal is used and a potential thereof is gradually increased with time.

The comparison unit 230 compares, for each of the columns, a pixel signal of the column with the reference signal. The comparison unit 230 supplies the voltage conversion unit 260 with a comparison result signal indicating a comparison result of each of the columns.

The timing control unit 213 controls operation timing of each of the circuits inside the solid-state imaging element 200 in accordance with control of the imaging control unit 130.

The voltage conversion unit 260 converts voltage of the comparison result signal for each of the columns. Here, the upper substrate 201 uses voltage higher than voltage of the circuits inside the lower substrate 203. Due to this, the voltage conversion unit 260 steps down a high-voltage comparison result signal from the upper substrate 201 and supplies the comparison result signal to the logic circuit 285.

The logic circuit 285 executes, for each of the columns, logical calculation for a clock signal from the timing control unit 213 and the comparison result signal. The logic circuit 285 generates a clock signal for counting by the logical calculation and supplies the clock signal to the counting unit 290.

The counting unit 290 counts, for each of the columns, a count value in synchronization with the clock signal. The counting unit 290 outputs, as pixel data, data indicating the count value to the recording unit 120 in accordance with control of the horizontal scanning circuit 214. Image data is generated by arraying pieces of the pixel data of the respective pixel circuits 220. Furthermore, an analog pixel signal is converted into digital pixel data by the counting for each of the columns. That is, AD conversion is performed in parallel for each of the columns.

The horizontal scanning circuit 214 sequentially selects a column and outputs pixel data in accordance with the control of the timing control unit 213.

Note that the vertical scanning circuit 211, the reference voltage source 212, the pixel array unit 215, and the comparison unit 230 are arranged on the upper substrate 201, and the remaining circuits are arranged on the lower substrate 203, but the arrangement of the circuits on the respective substrates is not limited to this configuration.

[Exemplary Configuration of Pixel Circuit]

Figure 4:
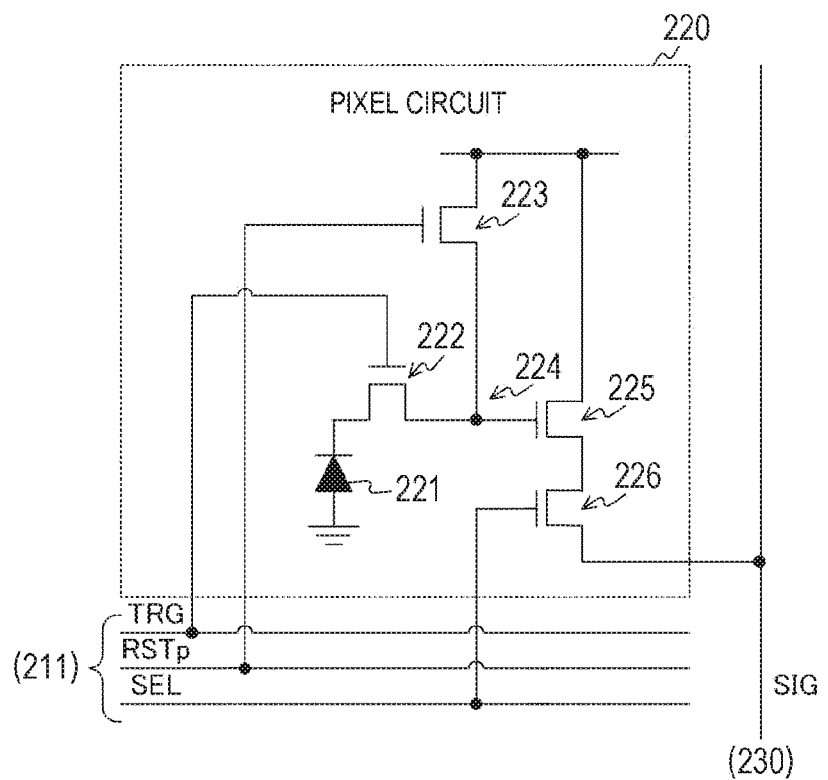
FIG. 4 is a circuit diagram illustrating an exemplary configuration of a pixel circuit according to the first embodiment of the present technology.

FIG. 4 is a circuit diagram illustrating an exemplary configuration of one pixel circuit 220 according to the first embodiment of the present technology. The pixel circuit 220 includes a photodiode 221, a transfer transistor 222, a reset transistor 223, a floating diffusion layer 224, an amplification transistor 225, and a selection transistor 226.

The photodiode 221 photoelectrically converts incident light to generate electric charge. The transfer transistor 222 transfers the electric charge from the photodiode 221 to the floating diffusion layer 224 in accordance with a transfer signal TRG from the vertical scanning circuit 211.

The reset transistor 223 initializes an electric charge amount by extracting the electric charge from the floating diffusion layer 224 in accordance with a reset signal RSTp from the vertical scanning circuit 211. The floating diffusion layer 224 accumulates the electric charge and generates voltage corresponding to the accumulated electric charge amount.

The amplification transistor 225 amplifies the voltage of the floating diffusion layer 224. The selection transistor 226 supplies an amplified voltage signal to the comparison unit 230 as a pixel signal SIG in accordance with a selection signal SEL from the vertical scanning circuit 211.

Note that, as far as a pixel signal can be generated by photoelectric conversion, the circuit configuration of the pixel circuit 220 is not limited to the configuration illustrated in FIG. 4.

[Exemplary Configuration of Comparison Unit]

Figure 5:
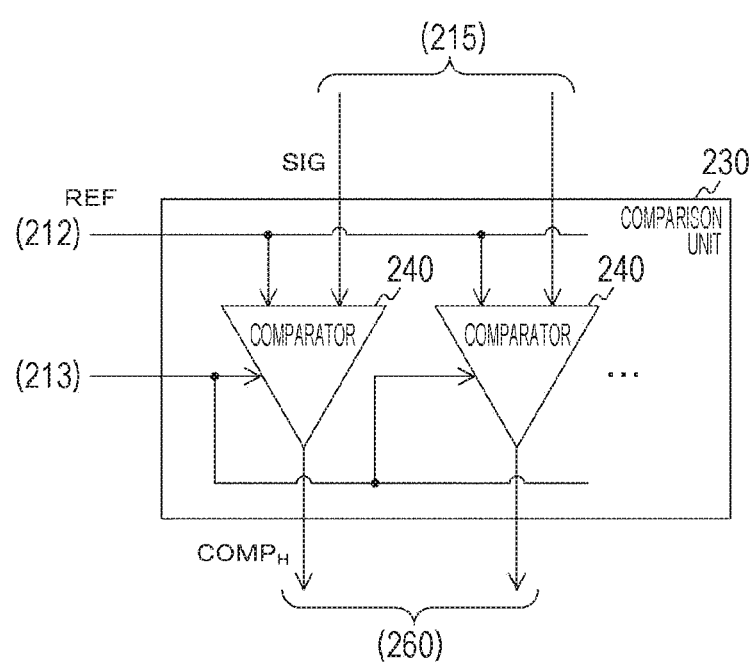
FIG. 5 is a block diagram illustrating an exemplary configuration of a comparison unit according to the first embodiment of the present technology.

FIG. 5 is a block diagram illustrating an exemplary configuration of the comparison unit 230 according to the first embodiment of the present technology. The comparison unit 230 includes a comparator 240 for each of the columns. Each comparator 240 receives: a pixel signal SIG from a corresponding column; and a reference signal REF from the reference voltage source 212.

The comparator 240 compares the pixel signal SIG with the reference signal REF. The comparator 240 generates a comparison result signal $COMP_H$ indicating a comparison result and supplies the comparison result signal to the voltage conversion unit 260. Furthermore, the comparator 240 is initialized at predetermined timing by a reset signal from the timing control unit 213.

Figure 6:
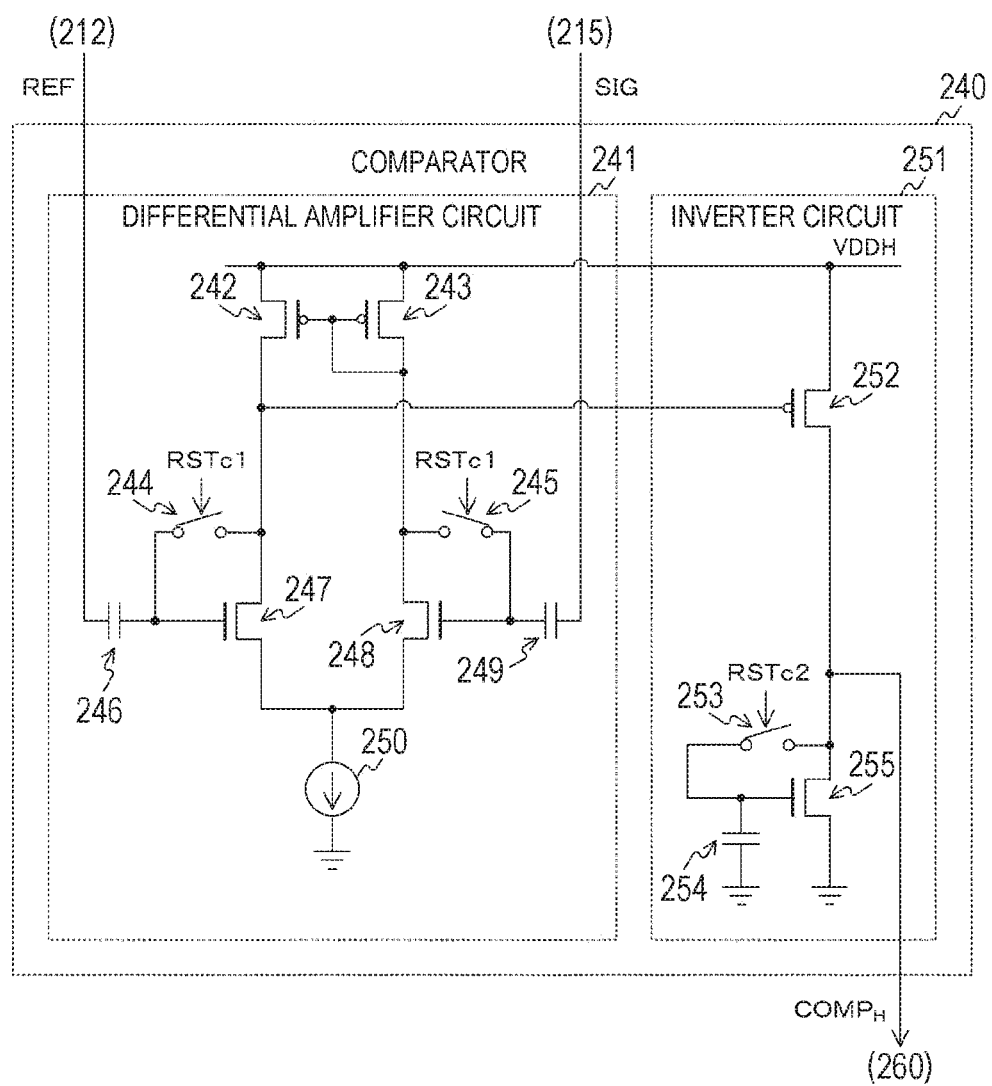
FIG. 6 is a circuit diagram illustrating an exemplary configuration of a comparator according to the first embodiment of the present technology.

FIG. 6 is a circuit diagram illustrating an exemplary configuration of the comparator 240 according to the first embodiment of the present technology. The comparator 240 includes a differential amplifier circuit 241 and an inverter circuit 251.

The differential amplifier circuit 241 includes pMOS transistors 242 and 243, switches 244 and 245, capacitors 246 and 249, nMOS transistors 247 and 248, and a constant current source 250.

The pMOS transistor 242 and the nMOS transistor 247 are connected in series between a power source potential VDDH and the constant current source 250. Furthermore, a connection point between the pMOS transistor 242 and the nMOS transistor 247 is connected to the inverter circuit 251.

The pMOS transistor 243 and the nMOS transistor 248 are connected in series between the power source potential VDDH and the constant current source 250. Furthermore, gates of the pMOS transistors 242 and 243 are commonly connected to a drain of the pMOS transistor 243.

The reference signal REF is received in one end of the capacitor 246, and the other end of the capacitor is connected to the switch 244 and a gate of the nMOS transistor 247. The pixel signal SIG is received in one end of the capacitor 249, and the other end of the capacitor is connected to the switch 245 and a gate of the nMOS transistor 248.

The switch 244 opens/closes a path between the gate of the nMOS transistor 247 and a connection point between the pMOS transistor 242 and the nMOS transistor 247 in accordance with a reset signal RSTc1 from the timing control unit 213.

The switch 245 opens/closes a path between the gate of the nMOS transistor 248 and a connection point between the pMOS transistor 243 and the nMOS transistor 248 in accordance with the reset signal RSTc1 from the timing control unit 213. The constant current source 250 supplies constant current.

With the circuit configuration described above, the differential amplifier circuit 241 amplifies a difference between the pixel signal SIG and the reference signal REF and outputs the amplified signal to the inverter circuit 251. Furthermore, the differential amplifier circuit 241 is initialized by the reset signal RSTc1.

The inverter circuit 251 includes a pMOS transistor 252, a switch 253, a capacitor 254, and an nMOS transistor 255.

The pMOS transistor 252 and the nMOS transistor 255 are connected in series between the power source potential VDDH and a reference potential GND1. Furthermore, a connection point between the pMOS transistor 252 and the nMOS transistor 255 is connected to the voltage conversion unit 260. Here, the reference potential GND1 is a potential lower than the power source potential VDDH, and for example, a ground potential or zero volts (V) is used as the reference potential GND1.

The capacitor 254 has one end connected to a terminal of the reference potential GND1 and has the other end connected to the switch 253 and a gate of the nMOS transistor 255.

The switch 253 opens/closes a path between the gate of the nMOS transistor 255 and the connection point between the pMOS transistor 252 and the nMOS transistor 255 in accordance with a reset signal RSTc2 from the timing control unit 213.

With the circuit configuration described above, the inverter circuit 251 inverts a signal from the differential amplifier circuit 241 and outputs the inverted signal as a comparison result signal $COMP_H$. In a case where the pixel signal SIG has a potential higher than that of the reference signal REF, the comparison result signal $COMP_H$ having a low level (GND1) is output. On the other hand, in a case where the pixel signal SIG has the potential equal to or lower than that of the reference signal REF, the comparison result signal $COMP_H$ having a high-level (VDDH) is output. Here, the potential of the reference signal REF is gradually increased from the reference potential GND1. Due to this, the comparison result signal $COMP_H$ has the low level in an initial state, and at timing when the reference signal REF becomes higher than the pixel signal SIG thereafter, the comparison result signal is inverted and comes to have a high level.

[Exemplary Configuration of Voltage Conversion Unit]

Figure 7:
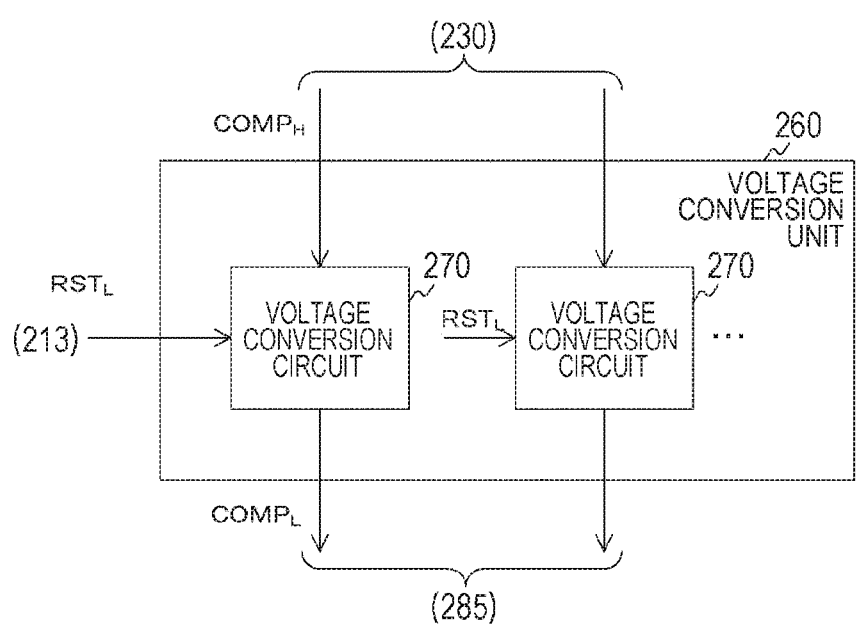
FIG. 7 is a block diagram illustrating an exemplary configuration of a voltage conversion unit according to the first embodiment of the present technology.

FIG. 7 is a block diagram illustrating an exemplary configuration of the voltage conversion unit 260 according to the first embodiment of the present technology. The voltage conversion unit 260 includes a voltage conversion circuit 270 for each of the columns.

The voltage conversion circuit 270 steps down voltage of a comparison result signal $COMP_H$ from a corresponding column and supplies the comparison result signal to the logic circuit 285 as $COMP_L$. Furthermore, the voltage conversion circuit 270 is initialized by a reset signal $RST_L$ from the timing control unit 213 before the counting unit 290 starts the counting.

Figure 8:
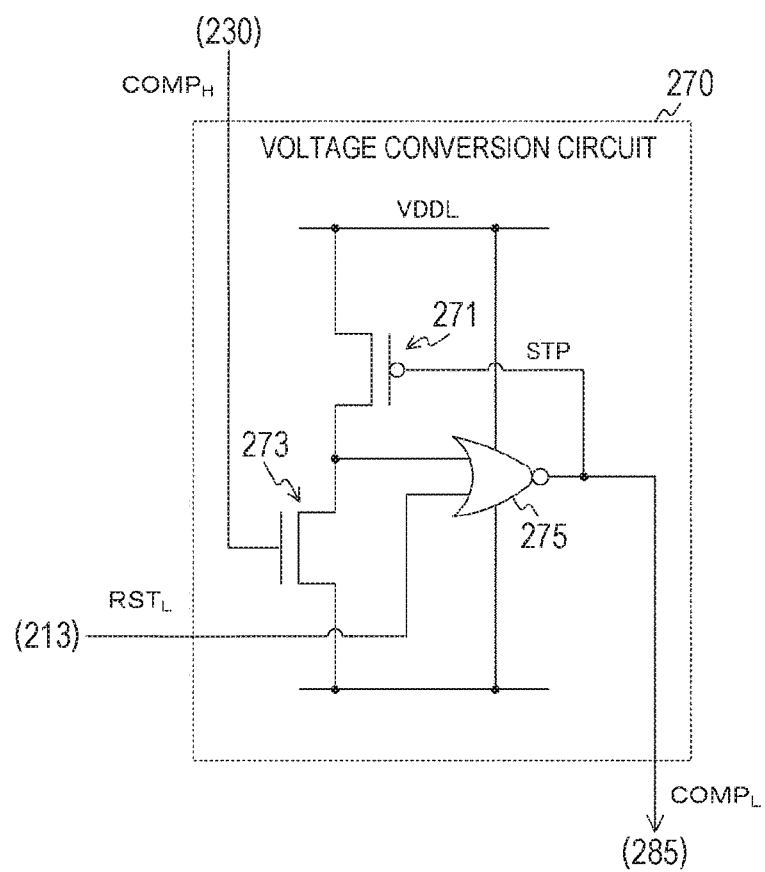
FIG. 8 is a circuit diagram illustrating an exemplary configuration of a voltage conversion circuit according to the first embodiment of the present technology.

FIG. 8 is a circuit diagram illustrating an exemplary configuration of the voltage conversion circuit 270 according to the first embodiment of the present technology. The voltage conversion circuit 270 includes a current source transistor 271, a conversion transistor 273, and a negative OR (NOR) gate 275. For example, a pMOS transistor is used as the current source transistor 271, and an nMOS transistor is used as the conversion transistor 273, for example.

The current source transistor 271 and the conversion transistor 273 are connected in series between a power source potential VDDL and a reference potential GND2. Here, the power source potential VDDL has a potential lower than that of the power source potential VDDH. Furthermore, the reference potential GND2 is a potential lower than that of the power source potential VDDL, and for example, the ground potential or zero volts (V) is used as the reference potential GND2.

Furthermore, the reference potential GND1 of the upper substrate 201 and the reference potential GND2 of the lower substrate 203 are set substantially the same, for example. Note that these reference potentials may have different values. Even in such a case, voltage between the power source potential VDDH and the reference potential GND1 is higher than voltage between the power source potential VDDL and the reference potential GND2.

A comparison result signal $COMP_H$ is received in a gate of the conversion transistor 273. The conversion transistor 273 inverts a logic (VDDH or GND1) of the comparison result signal $COMP_H$ to a logic (GND2 or VDDL) by using the current from the current source transistor 271, and outputs the comparison result signal from a drain. Note that the comparison result signal $COMP_H$ is an example of an input signal described in the claims.

A predetermined stop signal STP is received in a gate of the current source transistor 271. The current source transistor 271 supplies predetermined current to the conversion transistor 273 over a period until the stop signal STP is received.

The NOR gate 275 outputs a negative OR between the output signal from the conversion transistor 273 and the reset signal $RST_L$ from the timing control unit 213. A signal of the negative OR has a potential of the power source potential VDDL or the reference potential GND2. The NOR gate 275 supplies the signal to the logic circuit 285 as the comparison result signal $COMP_L$. Furthermore, the NOR gate 275 transmits a high-level (power source potential VDDL) signal of the negative OR to the gate of the current source transistor 271 as the stop signal STP.

Note that the voltage conversion circuit 270 steps down the voltage of the signal, but can also step up the voltage. In this case, for example, the conversion transistor 273 may be replaced with a pMOS, the current source transistor 271 may be replaced with an nMOS, and the NOR gate 275 may be replaced with an OR gate. At that time, a signal having a potential changed from one of the lower power source potential VDDL and the reference potential GND2 to the other thereof is received in the conversion transistor 273. Furthermore, since the current source transistor 271 is replaced with the nMOS, the stop signal STP having the reference potential GND2 is received in the current source transistor 271. Additionally, the voltage conversion circuit 270 is arranged inside the imaging device 100, a device or an apparatus in which the voltage conversion circuit 270 is provided is not limited to the imaging device 200 if voltage conversion is required therein.

Figures 9, 10:
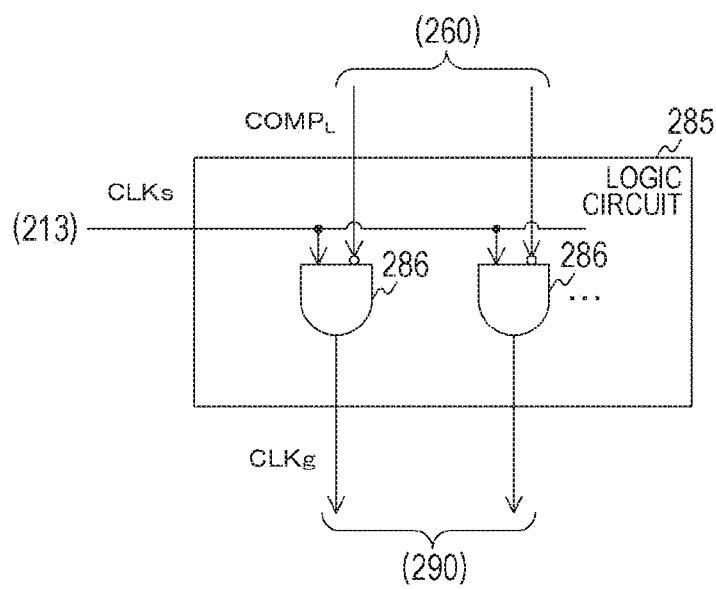
FIG. 9 is a diagram illustrating exemplary operation of the voltage conversion circuit according to the first embodiment of the present technology.
FIG. 10 is a circuit diagram illustrating an exemplary configuration of a logic circuit according to the first embodiment of the present technology.

FIG. 9 is a diagram illustrating exemplary operation of the voltage conversion circuit 270 according to the first embodiment of the present technology. The timing control unit 213 initializes the comparator 240 to fix the comparison result signal $COMP_H$ at a low level before the counting unit 290 starts the counting, and the timing control unit further initializes the voltage conversion circuit 270 by a high-level reset signal $RST_L$.

Here, the voltage conversion circuit 270 is preferably initialized after the initialization of the comparator 240. The reason is that in a case where the voltage conversion circuit 270 is initialized when the comparison result signal $COMP_H$ has the high-level, both the current source transistor 271 and the conversion transistor 273 are turned ON, and through current flows from the power source potential VDDL to the reference potential GND2.

When the high-level reset signal $RST_L$ is received, the NOR gate 275 outputs a low-level comparison result signal $COMP_L$ and initializes and turns ON the current source transistor 271. The current source transistor 271 shifted to the ON state starts supplying the predetermined current.

Then, the timing control unit 213 sets the reset signal $RST_L$ to the low level at the time of starting the counting. The comparison result signal $COMP_H$ has the low level (GND1) at the time of starting the counting and is inverted to have the high level (VDDH) at timing in accordance with a light amount.

Before inverting the comparison result signal $COMP_H$, the NOR gate 275 outputs the comparison result signal $COMP_L$ having the low level (GND2). On the other hand, after inverting the comparison result signal $COMP_H$, the conversion transistor 273 transits from an OFF state to the ON state, and the NOR gate 275 outputs the comparison result signal $COMP_L$ having the high level (VDDL). The comparison result signal $COMP_L$ is received in the current source transistor 271 as the stop signal STP, and the current source transistor 271 is turned OFF and stops the current supply. Furthermore, the comparison result signal $COMP_L$ is fixed to have the high level (in other words, latched) from the current stop to next initialization. Note that the NOR gate 275 is an example of a control circuit described in the claims.

As described above, the signal having the potential (VDDL) lower than the power source potential VDDH is received in the current source transistor 271 and the transistor inside the NOR gate 275. That is why a transistor having lower breakdown voltage than that of the conversion transistor 273 is used as the current source transistor 271 or the like.

In many cases, a high breakdown voltage transistor suitable for high voltage is used and driven at the high voltage at a power source boundary between the high voltage and the low voltage in an input-side circuit in order to allow input in a wide voltage range. On the other hand, a low breakdown voltage transistor suitable for high-density packaging is used and driven at the low voltage in an output-side circuit. With this configuration, the optimal area and optimal electric power can be achieved. There is a case where the more minute the transistor processing is, the more the threshold voltage of the high breakdown voltage transistor is increased than drive voltage (VDDL or the like) of the low breakdown voltage transistor. Due to this, in a case of arranging inverter including a high breakdown voltage transistor instead of the voltage conversion circuit 270, there is a case where: the pMOS transistor is not turned ON when the low-level comparison result signal $COMP_H$ is received; and a logic of a signal cannot be accurately propagated.

However, in the voltage conversion circuit 270, only the conversion transistor 273 is provided as the high breakdown voltage transistor, and other transistors are the low breakdown voltage transistors. With this configuration, desired signal propagation can be performed even under the voltage conditions as described above.

Furthermore, to achieve high-speed conversion performance, the AD conversion is executed in parallel for each of the columns in the solid-state imaging element 200. Moreover, the signal transition of the comparison result signal $COMP_H$ is slower than that of a normal logic circuit, and additionally, the voltage conversion circuit 270 is arranged in each of the columns for the AD conversion in each of the columns. These voltage conversion circuits 270 are required to be operated while sharing the same power source and the same ground. Due to this, current generated by propagating a signal to a voltage conversion circuit 270 of a certain column is strongly required to be prevented from flowing into a voltage conversion circuit 270 of a different column, and it is strongly required to avoid occurrence of transition (glidge) twice or more times in the different voltage conversion circuit. In the voltage conversion circuit 270 described above, direct current (DC) current does not flow and only instantaneous current at the time of signal transition flows. In addition, since shifting of the current source transistor 271 to the OFF state is controlled only by a logic signal driven at the output-side power source potential VDDL, a flowing time of the instantaneous current can be shortened more than in the configuration in which the inverter is provided instead of the voltage conversion circuit 270. Therefore, fluctuation in the power source potential and fluctuation in the reference potential which are caused by the signal transition can be largely suppressed. With this configuration, the glitch caused by influence of the fluctuation of the power source potential and the like can be suppressed.

Such a glitch suppression effect is particularly effective in a case where the power source voltage (that is, the voltage between the VDDH and the GND2) on the output side is lower than the threshold voltage of the conversion transistor 273 on the input side.

Furthermore, a configuration of using a source-grounded circuit including an nMOS transistor and a resistor instead of the voltage conversion circuit 270 is also conceivable, but this configuration is not desirable. In this source-grounded circuit, when the comparison result signal $COMP_H$ has the high level, current constantly flows and the power consumption is extremely increased. On the other hand, since the NOR gate 275 controls the current source transistor 271 in the voltage conversion circuit 270 after the inversion and cuts off the current, increase in the power consumption can be suppressed.

[Exemplary Configuration of Logic Circuit]

FIG. 10 is a circuit diagram illustrating an exemplary configuration of the logic circuit 285 according to the first embodiment of the present technology. The logic circuit 285 includes an AND gate 286 for each of the columns.

The AND gate 286 outputs, as a gated clock CLKg, a logical product of a reference clock CLKs from the timing control unit 213 and an inverted value of the comparison result signal $COMP_L$ from the voltage conversion unit 260 to the counting unit 290.

[Exemplary Configuration of Counting Unit]

Figure 11:
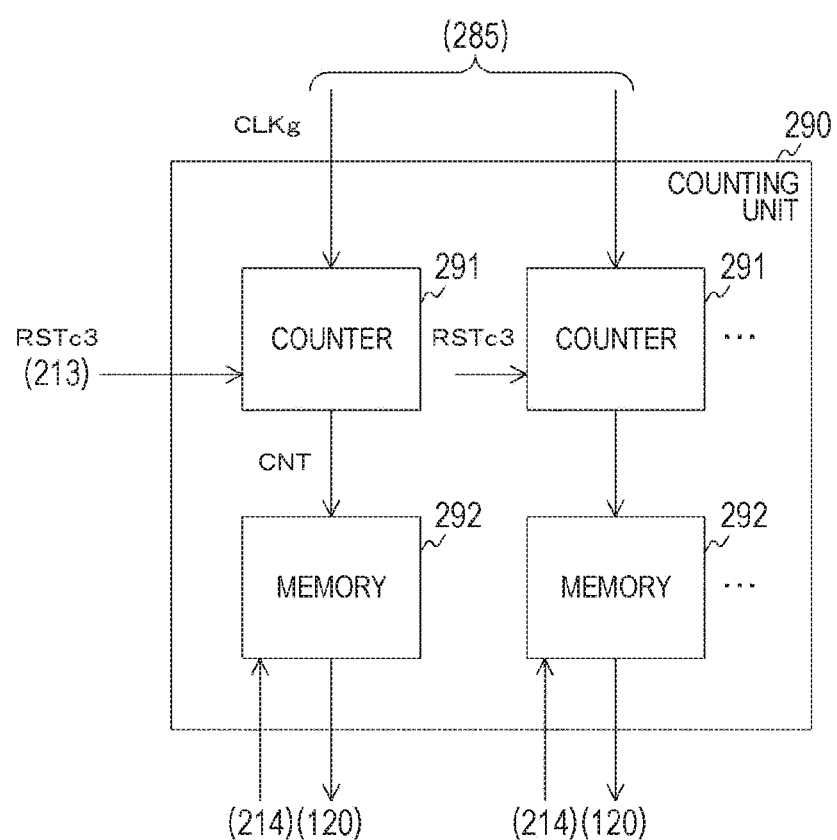
FIG. 11 is a block diagram illustrating an exemplary configuration of a counting unit according to the first embodiment of the present technology.

FIG. 11 is a block diagram illustrating an exemplary configuration of the counting unit 290 according to the first embodiment of the present technology. The counting unit 290 includes a counter 291 and a memory 292 for each of the columns.

The counter 291 counts a count value in synchronization with the gated clock CLKg from the logic circuit 285. The counter 291 causes the memory 292 to hold data indicating the count value as pixel data. With this configuration, an analog pixel signal is AD converted to digital pixel data. Furthermore, the timing control unit 213 initializes the count value by a reset signal RSTc3 at the start of the AD conversion.

The memory 292 holds the pixel data. The memory 292 outputs the pixel data to the recording unit 120 in accordance with the control of the horizontal scanning circuit 214.

Note that the solid-state imaging element 200 performs various signal processing such as correlated double sampling (CDS) processing, black level correction processing, and the like in addition to the AD conversion, but circuits that perform these pieces of signal processing are not illustrated.

Figure 12:
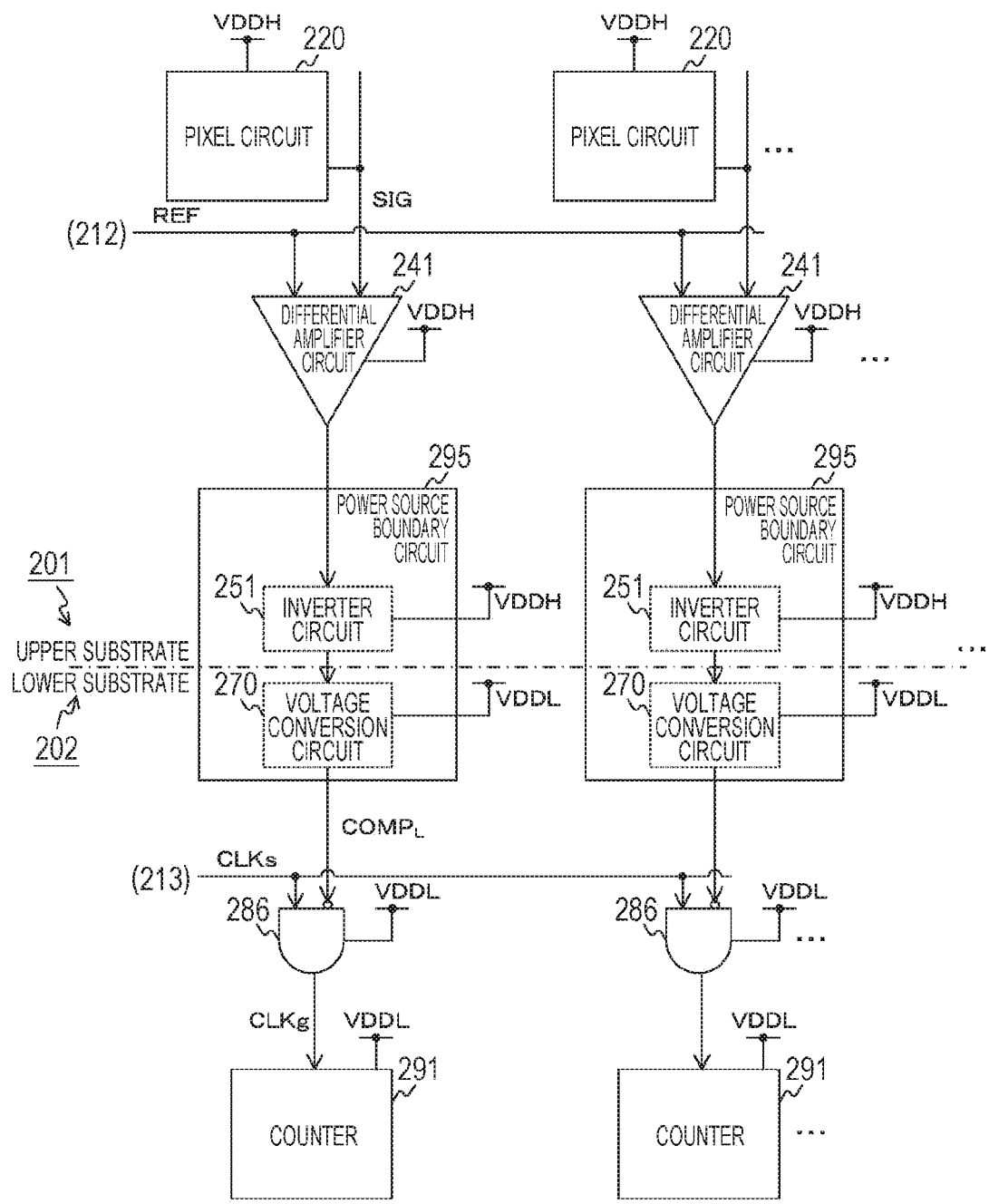
FIG. 12 is a diagram illustrating an exemplary configuration of the entire solid-state imaging element according to the first embodiment of the present technology.

FIG. 12 is a diagram illustrating an exemplary configuration of the entire solid-state imaging element 200 according to the first embodiment of the present technology. The pixel circuit 220 generates, for each of the columns, a pixel signal SIG, and the differential amplifier circuit 241 amplifies and outputs a difference between the pixel signal SIG and the reference signal REF. Then, the inverter circuit 251 inverts the signal from the differential amplifier circuit 241 and outputs the inverted signal as a comparison result signal $COMP_H$, and the voltage conversion circuit 270 steps down the comparison result signal $COMP_H$ and outputs the signal as $COMP_L$. The AND gate 286 generates a gated clock CLKg from the comparison result signal $COMP_L$ and the reference clock CLKs, and the counter 291 counts a count value in synchronization with the gated clock CLKg.

Since the inverter circuit 251 and the voltage conversion circuit 270 are located at a boundary between the power source potentials VDDH and VDDL, these circuits can be handled as the power source boundary circuits 295.

Figure 13A:
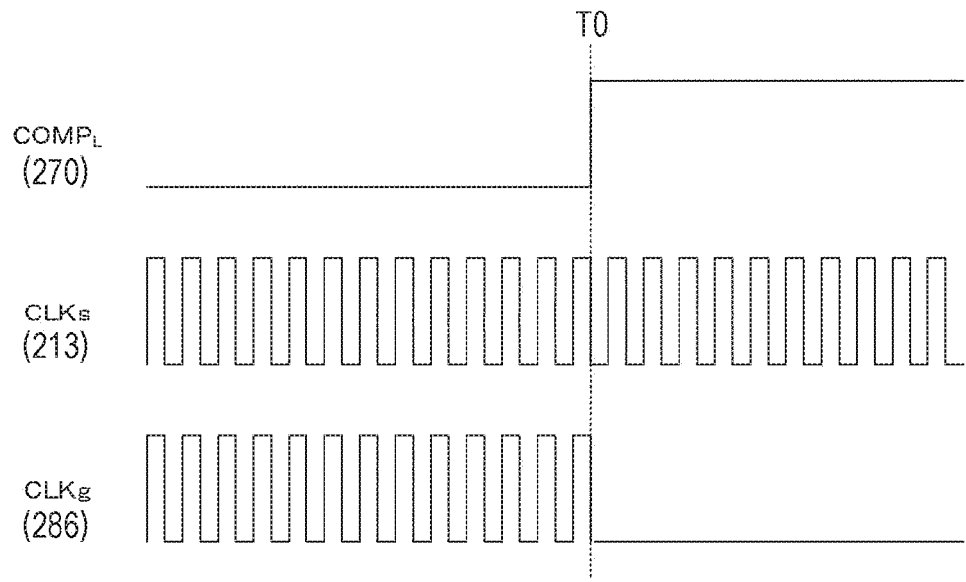
FIGS. 13A and 13B provides timing charts illustrating exemplary fluctuation in each of a comparison result signal and clock signals in each of the first embodiment of the present technology and a comparative example.
Figure 13B:
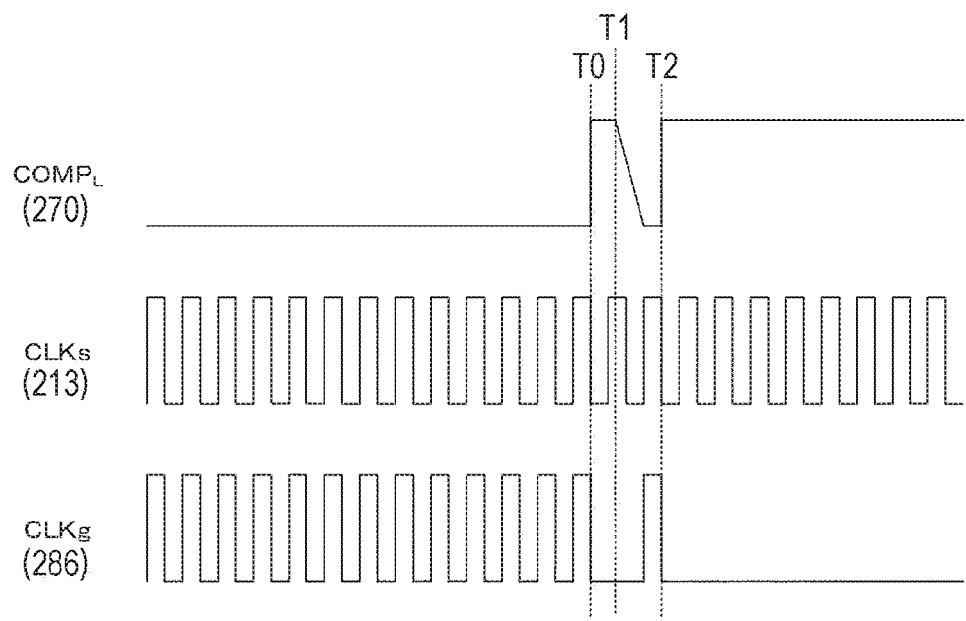

FIGS. 13A and 13B provides timing charts illustrating exemplary fluctuation in each of a comparison result signal and clock signals in each of the first embodiment of the present technology and a comparative example. In the drawing, FIG. 13A represents a timing chart illustrating the exemplary fluctuation in each of the comparison result signal and the clock signals in the solid-state imaging element 200. On the other hand, FIG. 13B in the drawing represents a timing chart illustrating the exemplary fluctuation in each of the comparison result signal and the clock signals in the comparative example in which an inverter is provided instead of the voltage conversion circuit 270.

In the solid-state imaging element 200, the comparison result signal $COMP_L$ has a low level in an initial state, and is inverted to have a high level at timing T0 in accordance with a light amount. The AND gate 286 generates a gated clock CLKg from the reference clock CLKs from the timing control unit 213 and the comparison result signal $COMP_L$. The gated clock CLKg is output during a period up to the timing T0, and a count value is counted in synchronization with the gated clock CLKg during this period.

On the other hand, in the comparative example, there may be a possibility that through current flows in the inverter when the comparison result signal $COMP_L$ is inverted. There may be a possibility that: current generated in a certain column causes fluctuation of the power source potential VDDL and fluctuation of the reference potential GND; and transition (glitch) occurs twice or more in the same column due to influence thereof. For example, after the comparison result signal $COMP_L$ transitions to have the high level at the timing T0, the comparison result signal is inverted again at timing T1 and timing T2. As a result, an unnecessary gated clock CLKg is generated immediately before the timing T2 and the like, and an error occurs in the count value.

In contrast, in the solid-state imaging element 200, since the current source transistor 271 is made to the OFF state at the time of inversion so as to prevent flow of the DC current as described above, the glitch can be suppressed while reducing the fluctuation of the power source potential VDDL and the fluctuation of the reference potential GND.

[Exemplary Operation of Solid-State Imaging Element]

Figure 14:
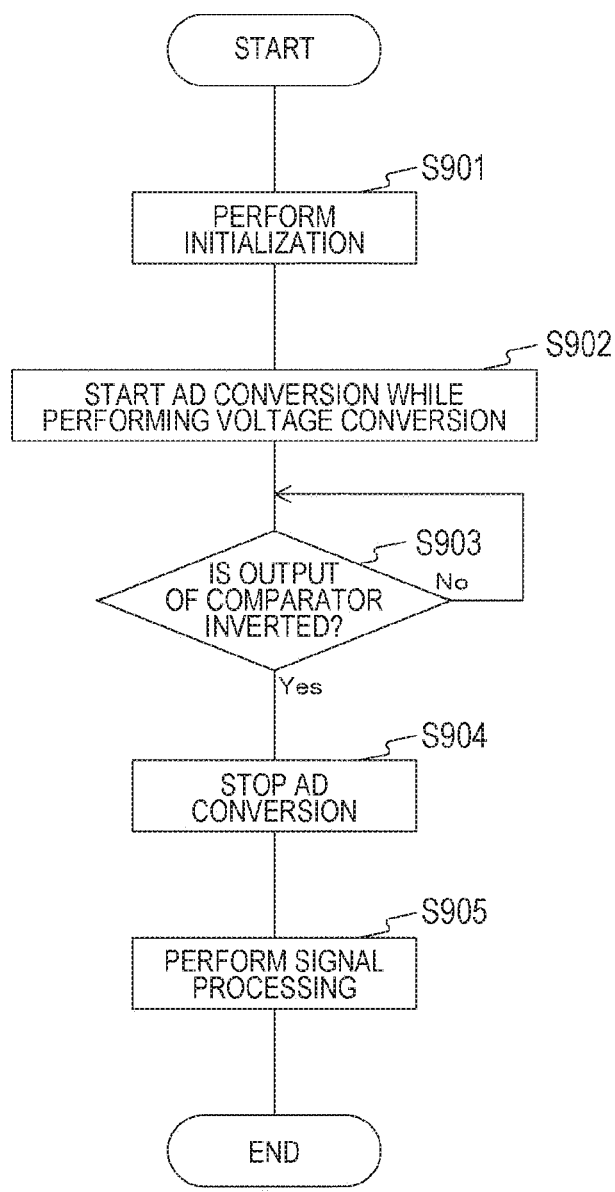
FIG. 14 is a flowchart illustrating exemplary operation of the solid-state imaging element according to the first embodiment of the present technology.

FIG. 14 is a flowchart illustrating exemplary operation of the solid-state imaging element 200 according to the first embodiment of the present technology. This operation is started, for example, when a predetermined application to capture image data is executed. The timing control unit 213 inside the solid-state imaging element 200 initializes the voltage conversion circuit 270 and the like (step S901). Then, the voltage conversion circuit 270 performs voltage conversion, and the comparator 240 and the counter 291 start AD conversion (step S902). The solid-state imaging element 200 determines whether or not the output of the comparator is inverted (step S903). In a case where the output is not inverted (step S903: No), the solid-state imaging element 200 repeats step S903.

On the other hand, in a case where the output is inverted (step S903: Yes), the solid-state imaging element 200 stops the AD conversion for a concerning column, and the current source transistor 271 of the column stops current supply (step S904). Steps S902 to S904 are executed for each of the columns in parallel.

The solid-state imaging element 200 performs signal processing such as CDS processing and the like, and ends the operation to capture the image data. When image data is continuously captured in synchronization with a vertical synchronization signal, steps S901 to S905 are repeatedly executed in synchronization with the vertical synchronization signal.

Thus, according to the first embodiment of the present technology, when a comparison result signal is inverted, the NOR gate 275 stops the current supply by using the stop signal STP, and therefore, it is possible to suppress fluctuation of the power source potential and fluctuation of the ground potential. Therefore, a glitch (instantaneous current) caused by the fluctuation of the power source potential and the like can be suppressed.

2. Second Embodiment

In a first embodiment described above, a timing control unit 213 initializes a comparator 240 and a voltage conversion circuit 270 before start of counting. However, in a case where the initialization of the voltage conversion circuit 270 is before the initialization of the comparator 240, there may be a possibility that both a current source transistor 271 and a conversion transistor 273 are turned ON, and through current flows. A solid-state imaging element 200 according to a second embodiment is different from that of the first embodiment in adding an enable control transistor that controls the voltage conversion circuit 270 to be enabled or disabled in order to give flexibility to initialization timing.

Figure 15:
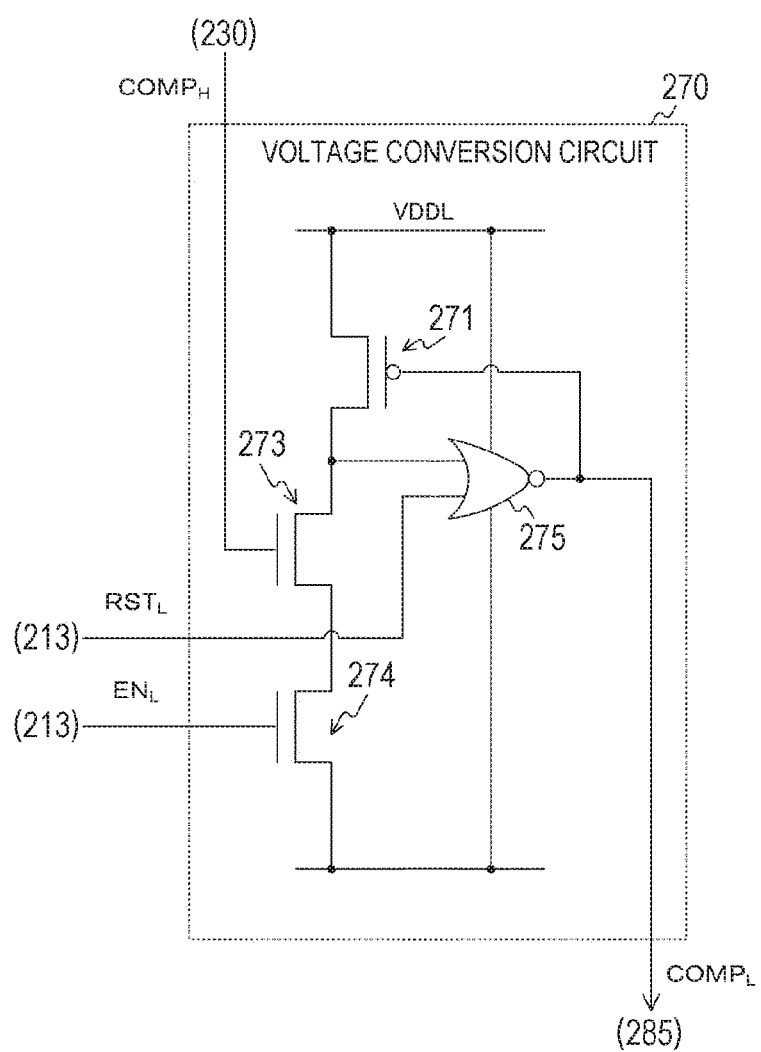
FIG. 15 is a circuit diagram illustrating an exemplary configuration of a voltage conversion circuit according to a second embodiment of the present technology.

FIG. 15 is a circuit diagram illustrating an exemplary configuration of the voltage conversion circuit 270 according to the second embodiment of the present technology. The voltage conversion circuit 270 of the second embodiment is different from that of the first embodiment in arranging the enable control transistor 274.

As the enable control transistor 274, an nMOS transistor is used, for example. The enable control transistor 274 is inserted between the conversion transistor 273 and a reference potential GND, and an enable signal $EN_L$ from the timing control unit 213 is received in a gate of the enable control transistor.

The enable signal $EN_L$ is a signal to control whether or not to enable conversion operation of the voltage conversion circuit 270. For example, in a case of enabling the conversion operation, the enable signal $EN_L$ is set to have a high level, and in a case of disabling the same, the enable signal is set to have a low level. In a case where the conversion operation is disabled, the conversion transistor 273 stops the voltage conversion.

Figure 16:
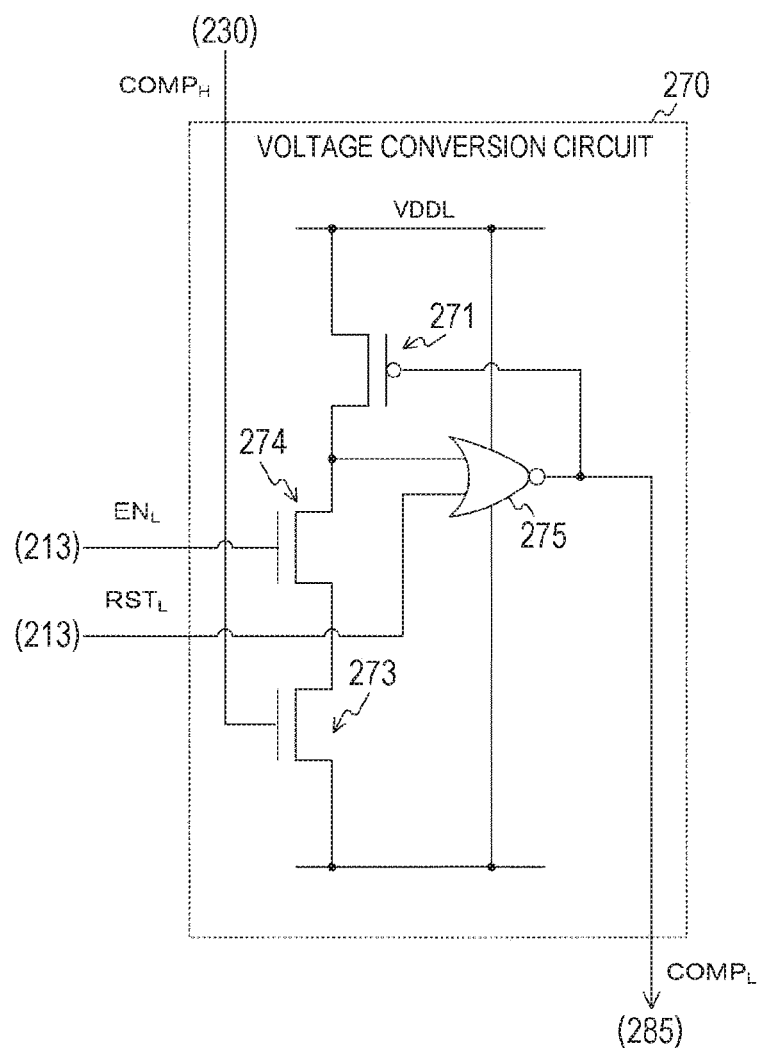
FIG. 16 is a circuit diagram illustrating an exemplary configuration of a voltage conversion circuit in which the order of transistors is swapped according to the second embodiment of the present technology.

Note that the enable control transistor 274 can also be arranged between the conversion transistor 273 and the current source transistor 271 as illustrated in FIG. 16 although the enable control transistor 274 is arranged on the reference potential GND side in FIG. 15.

With the addition of the enable control transistor 274, the timing control unit 213 can give flexibility to the initialization timing in each of the comparator 240 and the voltage conversion circuit 270. For example, the timing control unit 213 initializes each of the comparator 240 and the voltage conversion circuit 270 in a state where the conversion operation of the voltage conversion circuit 270 is disabled by the enable signal $EN_L$. The through current does not flow regardless of whichever comes to have earlier initialization timing because the enable control transistor 274 is in an OFF state.

Thus, according to the second embodiment of the present technology, the voltage conversion circuit 270 can be enabled or disabled by the enable control transistor 274, and therefore, the flexibility of the initialization timing can be improved.

3. Third Embodiment

In a second embodiment described above, a current source transistor 271 supplies constant current in accordance with a difference between a power source potential VDDL and a reference potential GND2, but through current at the time of transition of a $COMP_H$ cannot be limited. A voltage conversion circuit 270 of a third embodiment is different from that of the second embodiment in reducing power consumption by adding a current control transistor that limits the current to a certain level or less.

Figure 17:
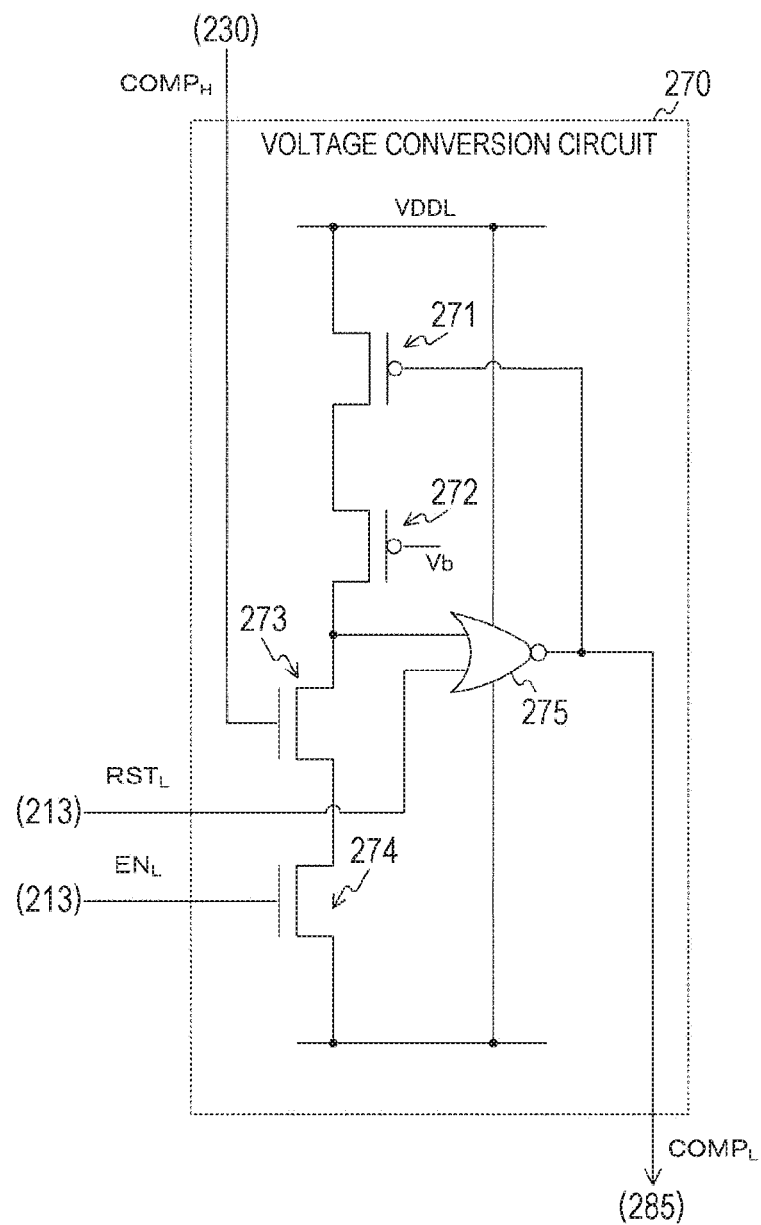
FIG. 17 is a circuit diagram illustrating an exemplary configuration of a voltage conversion circuit according to a third embodiment of the present technology.

FIG. 17 is a circuit diagram illustrating an exemplary configuration of the voltage conversion circuit 270 according to the third embodiment of the present technology. The voltage conversion circuit 270 of the third embodiment differs from that of the second embodiment in arranging a current control transistor 272.

As the current control transistor 272, a pMOS transistor is used, for example. The current control transistor 272 is inserted between the current source transistor 271 and a conversion transistor 273, and a bias potential Vb lower than the power source potential VDDL is applied to a gate of the current control transistor. The current control transistor 272 limits supplied current to a value less than a predetermined value in accordance with the bias potential Vb.

Thus, according to the third embodiment of the present technology, the current control transistor 272 limits the current to the value less than the predetermined value in accordance with the bias potential, and therefore, instantaneous power consumption at the time of transition of a $COMP_H$ can be reduced by adjusting the bias potential.

Modified Example

In the third embodiment described above, the bias potential Vb cannot be stopped at a time other than a reset period.

Figure 18:
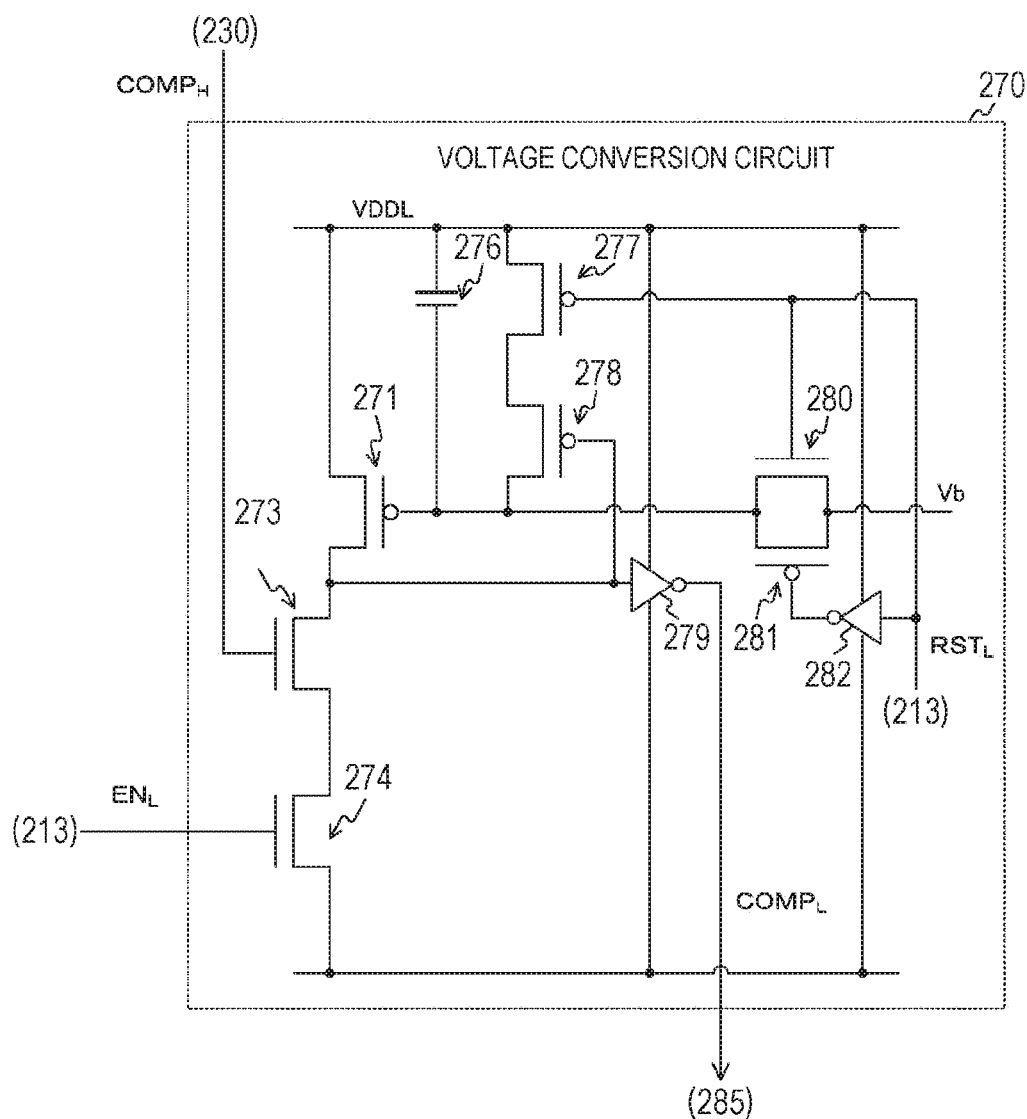
FIG. 18 is a circuit diagram illustrating an exemplary configuration of a voltage conversion circuit according to a modified example of the third embodiment of the present technology.

FIG. 18 is a circuit diagram illustrating an exemplary configuration of the voltage conversion circuit 270 according to a modified example of the third embodiment of the present technology. The voltage conversion circuit 270 of the modified example of the third embodiment does not include the current control transistor 272 and a NOR gate 275, and further includes a capacitor 276, pMOS transistors 277, 278, and 281, an nMOS transistor 280, and inverters 279 and 282.

The capacitor 276 has one end connected to a gate of the current source transistor 271 and the other end connected to a terminal of the power source potential VDDL. The pMOS transistors 277 and 278 are inserted in series between the terminal of the power source voltage VDDL and the gate of the current source transistor 271. The pMOS transistor 278 has a gate connected to a connection node between the current source transistor 271 and the conversion transistor 273. The inverter 279 inverts a signal from the conversion transistor 273 and outputs the inverted signal to a logic circuit 285 as a comparison result signal $COMP_L$.

The nMOS transistor 280 and the pMOS transistor 281 are connected in parallel between the gate of the current source transistor 271 and a terminal of the bias potential Vb. A reset signal $RST_L$ from a timing control unit 213 is received in gates of the nMOS transistor 280 and the pSMO transistor 277. The inverter 282 inverts the reset signal $RST_L$ and outputs the inverted signal to a gate of the pMOS transistor 281.

The nMOS transistor 280, the pMOS transistor 281, and the inverter 282 function as a switch that opens/closes a path between the gate of the current source transistor 271 and the terminal of the bias potential Vb. The switch is shifted to an ON state at the time of reset, and supplies the bias potential Vb to the current source transistor 271. At this time, the pMOS transistor 277 is shifted to an OFF state, and the path from the power source potential VDDL to the gate of the current source transistor 271 is cut off. On the other hand, in a case where the comparison result signal is inverted from a low level to a high level, the current source transistor 271 can be turned OFF by the pMOS transistor 278 discharging electric charge accumulated in the capacitor 276. Note that the circuit including the capacitor 276 and the pMOS transistors 277 and 278 is an example of a control circuit described in the claims.

Thus, according to the modified example of the third embodiment of the present technology, the supply of the bias voltage Vb can be stopped at a time other than the reset period by arranging, for example, the switch including the nMOS transistor 280, the pMOS transistor 281, and the inverter 282.

4. Fourth Embodiment

In a third embodiment described above, an entire voltage conversion circuit 270 is arranged on a lower substrate 203, but there may be a possibility that a circuit size of the lower substrate 203 is increased along with increase in the number of pixels. A solid-state imaging element 200 of a fourth embodiment is different from that of the third embodiment in that part of the voltage conversion circuit 270 is arranged on an upper substrate 201.

Figure 19:
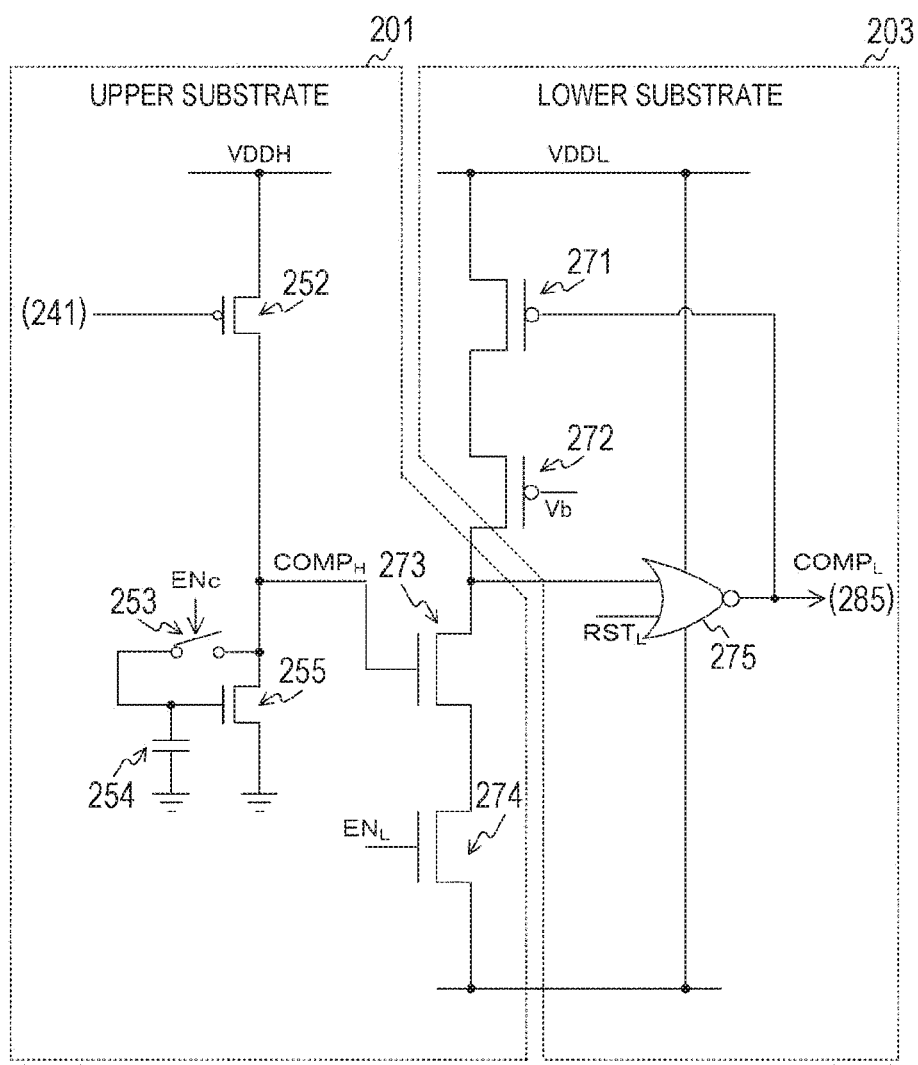
FIG. 19 is a circuit diagram illustrating exemplary circuits provided on an upper substrate and a lower substrate respectively according to a fourth embodiment of the present technology.

FIG. 19 is a circuit diagram illustrating exemplary circuits provided on the upper substrate 201 and the lower substrate 203 respectively according to the fourth embodiment of the present technology. A conversion transistor 273 and an enable control transistor 274 are further arranged on the upper substrate 201 of the fourth embodiment. On the other hand, a current source transistor 271, a current control transistor 272, and a NOR gate 275 are arranged on the lower substrate 203.

Thus, according to the fourth embodiment of the present technology, since the conversion transistor 273 and the enable control transistor 274 are provided on the upper substrate 201, the circuit size of the lower substrate 203 can be reduced by an amount of these transistors.

5. Fifth Embodiment

In a third embodiment described above, a vertical scanning circuit 211, a reference voltage source 212, and a comparison unit 230 are arranged on an upper substrate 201, but there may be a possibility that a circuit size of the upper substrate 201 is increased along with increase in the number of pixels. A solid-state imaging element 200 of a fifth embodiment is different from that of the third embodiment in arranging the vertical scanning circuit 211, the reference voltage source 212, and the comparison unit 230 on a lower substrate 203.

Figure 20:
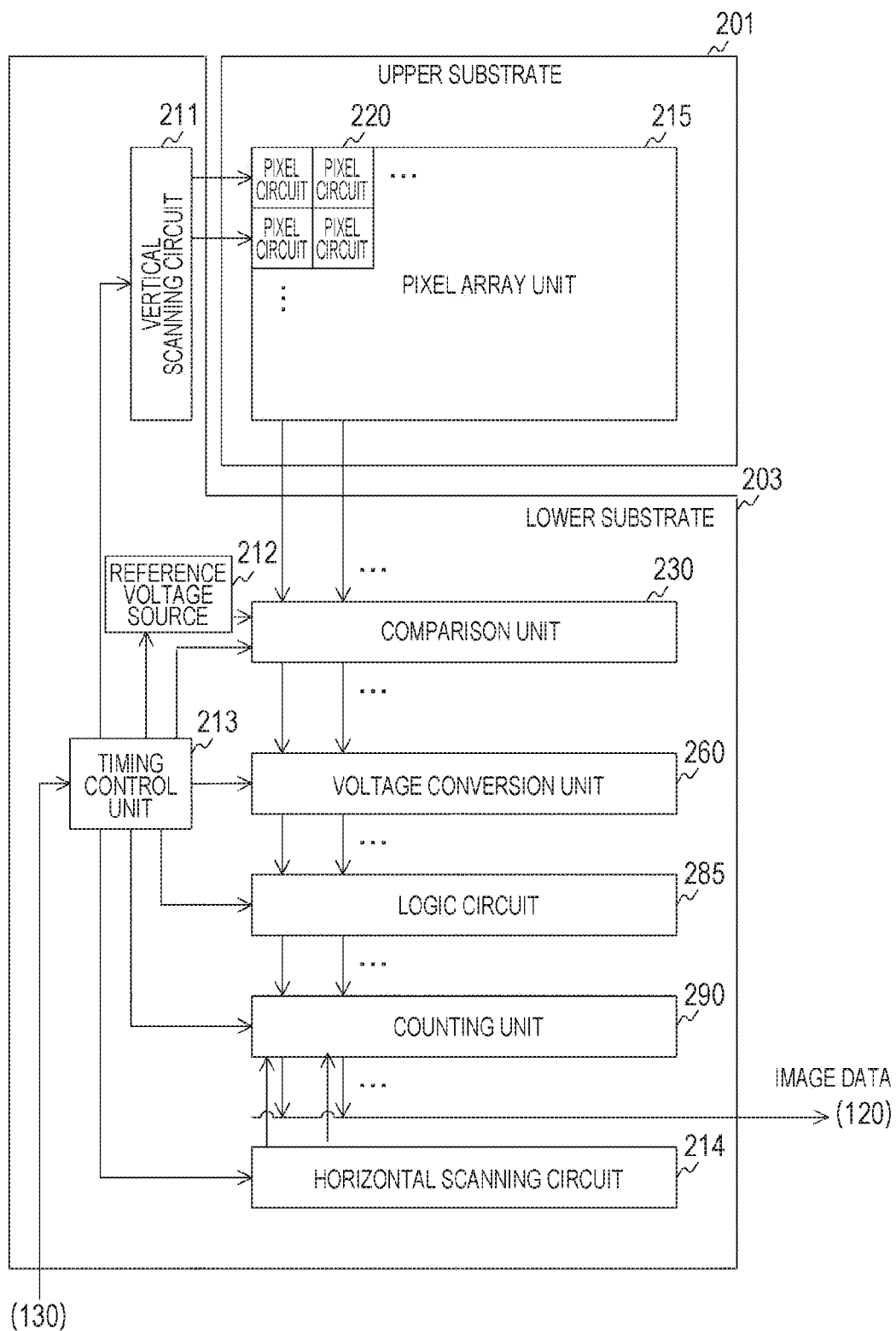
FIG. 20 is a circuit diagram illustrating exemplary circuits provided on an upper substrate and a lower substrate respectively according to a fifth embodiment of the present technology.

FIG. 20 is a circuit diagram illustrating exemplary circuits provided on the upper substrate 201 and the lower substrate 203 respectively according to the fifth embodiment of the present technology. Only a pixel array unit 215 is arranged on the upper substrate 201 of the fifth embodiment. On the other hand, the vertical scanning circuit 211, the reference voltage source 212, and the comparison unit 230 are further arranged on the lower substrate 203.

Thus, according to the fifth embodiment of the present technology, since the vertical scanning circuit 211, the reference voltage source 212, and the comparison unit 230 are provided on the lower substrate 203, the circuit size of the upper substrate 201 can be reduced by an amount of these circuits.

6. Sixth Embodiment

In a third embodiment described above, circuits in a solid-state imaging element 200 are arranged in a manner distributed onto two substrates including an upper substrate 201 and a lower substrate 203, but there may be a possibility that mounting area is increased along with increase in the number of pixels. A solid-state imaging element 200 according to a sixth embodiment is different from that of the third embodiment in arranging the circuits in a manner distributed onto three substrates.

Figure 21:
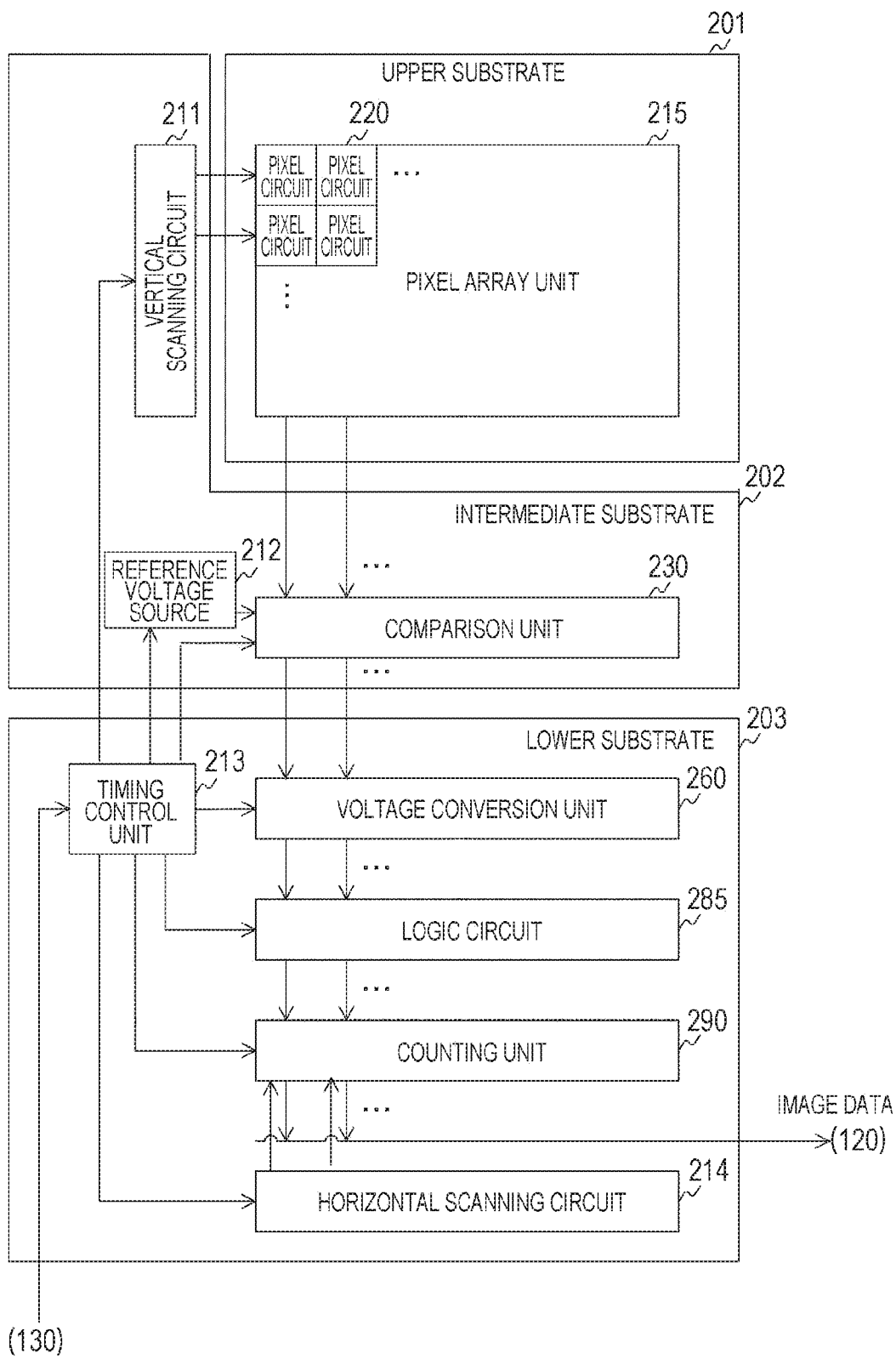
FIG. 21 is a circuit diagram illustrating exemplary circuits provided on an upper substrate, an intermediate substrate, and a lower substrate respectively according to a six embodiment of the present technology.

FIG. 21 is a circuit diagram illustrating exemplary circuits provided on the upper substrate 201, an intermediate substrate 202, and the lower substrate 203 respectively according to the six embodiment of the present technology. In the solid-state imaging element 200 of the sixth embodiment, the intermediate substrate 202 is further provided between the upper substrate 201 and the lower substrate 203.

Furthermore, only a pixel array unit 215 is arranged on the upper substrate 201. A vertical scanning circuit 211, a reference voltage source 212, and a comparison unit 230 are arranged on the intermediate substrate 202. Circuits similar to those of the third embodiment are arranged on the lower substrate 203.

Note that the upper substrate 201 is an example of a first substrate described in the claims. The intermediate substrate 202 is an example of a second substrate described in the claims. The lower substrate 203 is an example of a third substrate described in the claims.

Thus, according to the sixth embodiment of the present technology, since the circuits are arranged in a manner distributed onto the three substrates including the upper substrate 201, the intermediate substrate 202, and the lower substrate 203, the mounting area can be more reduced than in the case of arranging the circuits in a manner distributed onto the upper substrate 201 and the lower substrate 203.

7. Seventh Embodiment

In a sixth embodiment described above, an entire voltage conversion circuit 270 is arranged on a lower substrate 203, but there may be a possibility that a circuit size of the lower substrate 203 is increased along with increase in the number of pixels. A solid-state imaging element 200 according to a seventh embodiment is different from that of the sixth embodiment in arranging a part of the voltage conversion circuit 270 on an intermediate substrate 202.

Figure 22:
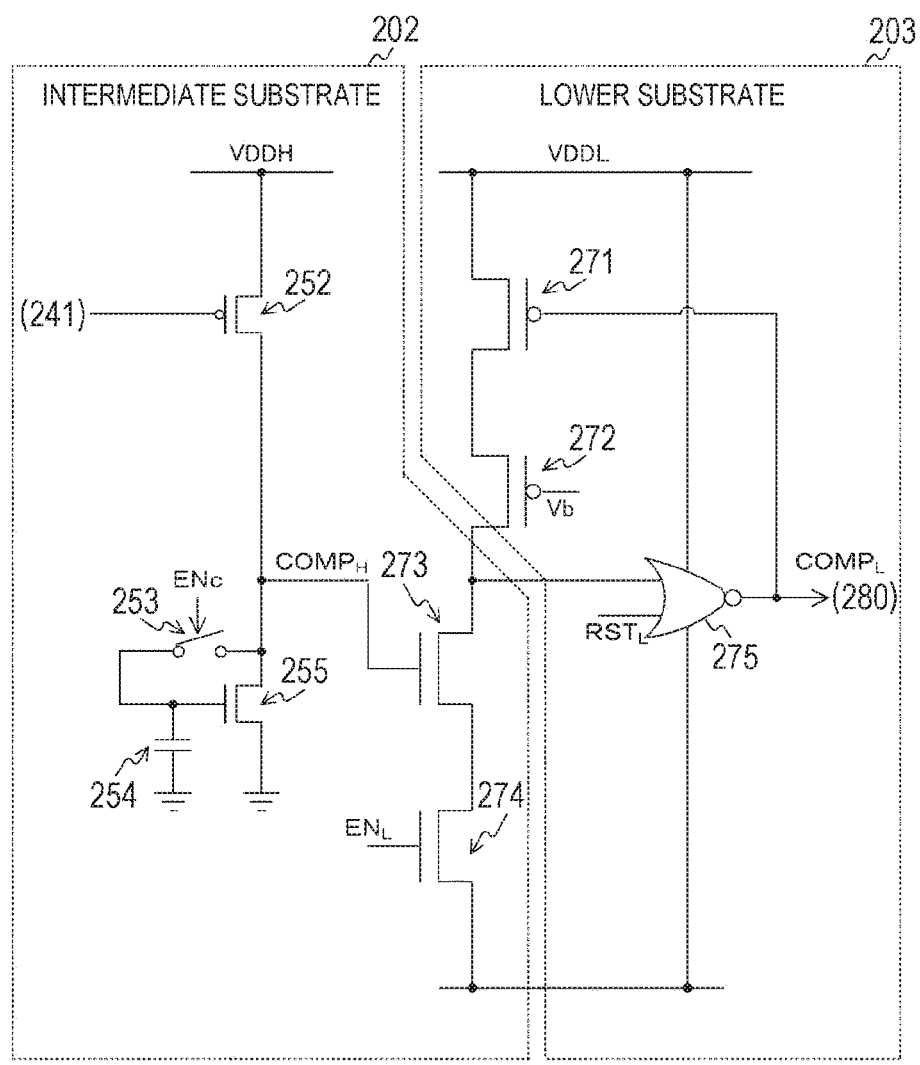
FIG. 22 is a circuit diagram illustrating exemplary circuits provided on an intermediate substrate and a lower substrate respectively according to a seventh embodiment of the present technology.

FIG. 22 is a circuit diagram illustrating exemplary circuits provided on the intermediate substrate 202 and the lower substrate 203 respectively in the seventh embodiment of the present technology. A conversion transistor 273 and an enable control transistor 274 are further arranged on the intermediate substrate 202 of the seventh embodiment. On the other hand, a current source transistor 271, a current control transistor 272, and a NOR gate 275 are arranged on the lower substrate 203.

Thus, according to the seventh embodiment of the present technology, since the conversion transistor 273 and the enable control transistor 274 are provided on the intermediate substrate 202, the circuit size of the lower substrate 203 can be reduced by an amount of these transistors.

8. Exemplary Application to Moving Object

The technology according to the present disclosure (present technology) can be applied to various products. For example, the technology according to the present disclosure may be implemented as a device mounted on any kinds of moving objects such as a car, an electric car, a hybrid electric car, a motorcycle, a bicycle, a personal mobility, an airplane, a drone, a ship, a robot, and the like.

Figure 23:
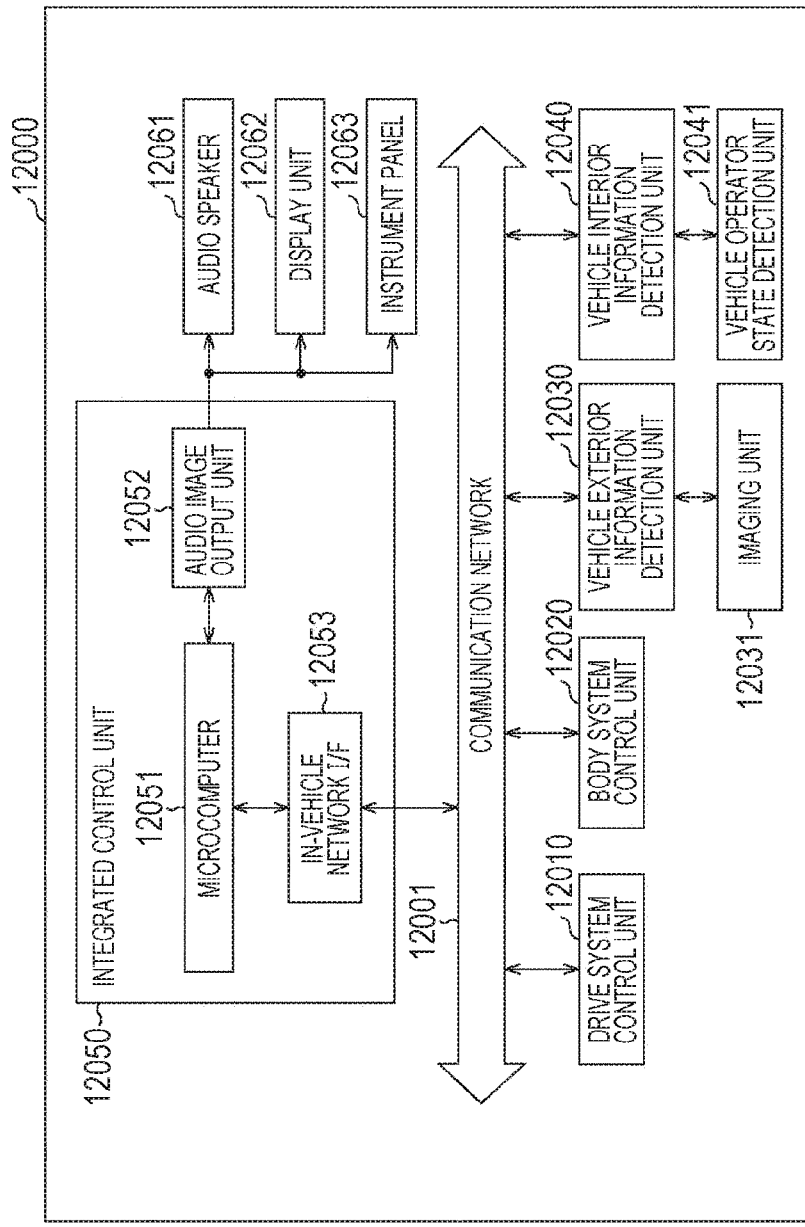
FIG. 23 is a block diagram illustrating an exemplary schematic configuration of a vehicle control system.

FIG. 23 is a block diagram illustrating a schematic exemplary configuration of a vehicle control system that is an exemplary moving object control system to which the technology according to the present disclosure can be applied.

The vehicle control system 12000 includes a plurality of electronic control units connected via a communication network 12001. In the example illustrated in FIG. 23, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices related to a drive system of a vehicle in accordance with various kinds of programs. For example, the drive system control unit 12010 functions as a control device of: a drive force generation device to generate drive force of a vehicle, such as an internal combustion engine or a drive motor; a drive force transmission mechanism to transmit drive force to wheels; a steering mechanism that adjusts a steering angle of the vehicle; a brake device that generates brake force of the vehicle; and the like.

The body system control unit 12020 controls operation of various kinds of devices equipped on a vehicle body in accordance with various kinds of programs. For example, the body system control unit 12020 functions as a control device of a keyless entry system, a smart key system, a power window device, or as a control device of various kinds of lamps such as a head lamp, a back lamp, a brake lamp, a turn indicator, a fog lamp, and the like. In this case, radio waves transmitted from a portable machine substituted for a key, or signals of various kinds of switches can be received in the body system control unit 12020. The body system control unit 12020 receives these radio waves or signals and controls a door lock device, a power window device, a lamp, and the like of the vehicle.

The vehicle exterior information detection unit 12030 detects information outside the vehicle having the vehicle control system 12000 built inside thereof. For example, the vehicle exterior information detection unit 12030 has an imaging unit 12031 connected. The vehicle exterior information detection unit 12030 causes the imaging unit 12031 to capture an image of the outside of the vehicle, and receives the captured image. The vehicle exterior information detection unit 12030 may perform object detection processing or distance detection processing relative to a person, a vehicle, an obstacle, a sign, characters on a road surface, or the like, on the basis of the received image.

The imaging unit 12031 is an optical sensor that receives light and outputs an electric signal in accordance with a received light amount. The imaging unit 12031 can output an electric signal as an image and can also output an electric signal as ranging information. Furthermore, the light received by the imaging unit 12031 may be visible light or may be invisible light such as infrared light or the like.

The vehicle interior information detection unit 12040 detects information inside the vehicle. For example, the vehicle interior information detection unit 12040 is connected to a vehicle operator state detection unit 12041 that detects a state of a vehicle operator. The vehicle operator state detection unit 12041 includes, for example, a camera that captures images of the vehicle operator, and the vehicle interior information detection unit 12040 may calculate a degree of fatigue or a degree of concentration of the vehicle operator on the basis of the detection information received from the vehicle operator state detection unit 12041, or may determine whether or not the vehicle operator is dozing off.

The microcomputer 12051 calculates a control target value for the drive force generation device, the steering mechanism, or the brake device on the basis of information related to the inside or the outside of the vehicle acquired by the vehicle exterior information detection unit 12030 or the vehicle interior information detection unit 12040, and can output a control command to the drive system control unit 12010. For example, the microcomputer 12051 can perform cooperative control in order to implement functions of an advanced driver assistance system (ADAS) including: collision avoidance or impact mitigation of a vehicle; adaptive cruise based on an inter-vehicle distance; speed maintaining cruise; vehicle collision warning; vehicle lane departure warning; or the like.

Furthermore, the microcomputer 12051 controls the drive force generation device, the steering mechanism, the brake device, or the like on the basis of information associated with a periphery of the vehicle and acquired by the vehicle exterior information detection unit 12030 or the vehicle interior information detection unit 12040, thereby achieving cooperative control in order to perform automated cruise or the like in which autonomous travel is performed without depending on operation by a vehicle operator.

Furthermore, the microcomputer 12051 can output a control command to the body system control unit 12020 on the basis of the vehicle exterior information acquired in the vehicle exterior information detection unit 12030. For example, the microcomputer 12051 controls a headlamp in accordance with a position of a preceding vehicle or an oncoming vehicle detected by the vehicle exterior information detection unit 12030, and can perform cooperative control in order to perform an anti-dazzling, such as switching a high beam to a low beam, or the like.

The audio image output unit 12052 transmits an output signal of at least one of audio or an image to an output device that can provide a notification of visual or audible information to a vehicle occupant or to the vehicle exterior. In the example of FIG. 23, an audio speaker 12061, a display unit 12062, and an instrument panel 12063 are exemplified as the output devices. The display unit 12062 may include at least one of an on-board display or a head-up display, for example.

Figure 24:
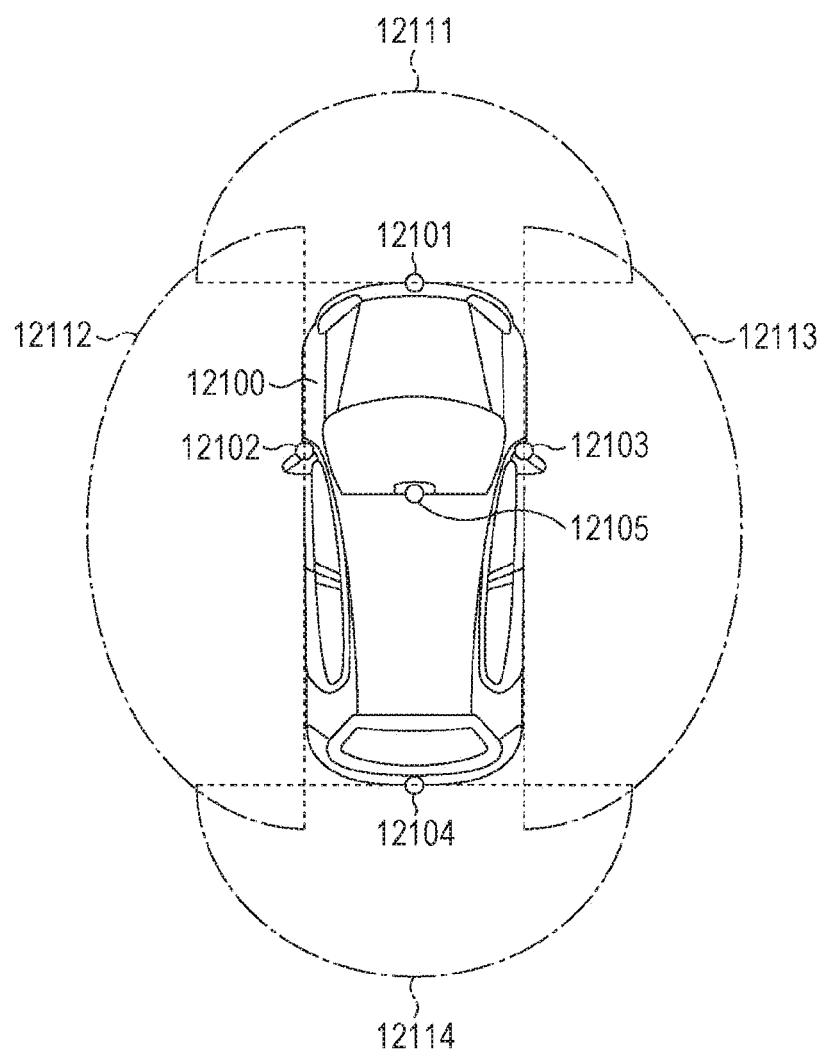
FIG. 24 is an explanatory diagram illustrating exemplary installation positions of imaging units.

FIG. 24 is a diagram illustrating exemplary installation positions of the imaging units 12031.

In FIG. 24, imaging units 12101, 12102, 12103, 12104, and 12105 are included as the imaging units 12031.

For example, the imaging units 12101, 12102, 12103, 12104, and 12105 are provided at positions such as a front nose, a side mirror, a rear bumper, a back door, an upper portion of a front windshield inside a vehicle interior of a vehicle 12100, and the like. The imaging unit 12101 provided at the front nose and the imaging unit 12105 provided at an upper portion of the front windshield inside the vehicle interior mainly capture images in front of the vehicle 12100. The imaging units 12102 and 12103 provided at the side mirrors mainly capture images of lateral sides of the vehicle 12100. The imaging unit 12104 provided at the rear bumper or the back door mainly captures an image behind the vehicle 12100. The imaging unit 12105 provided at the upper portion of the front windshield in the vehicle interior is mainly used to detect a preceding vehicle, a pedestrian, an obstacle, a traffic signal, a traffic sign, a lane, or the like.

Note that FIG. 24 illustrates exemplary imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the respective side mirrors, and an imaging range 12114 indicates an imaging range of the imaging unit 12104 provided at the rear bumper or the back door. For example, an overhead view image of the vehicle 12100 viewed from above can be obtained by overlapping pieces of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element including pixels for detecting a phase difference.

For example, the microcomputer 12051 obtains, on the basis of distance information obtained from the imaging units 12101 to 12104: a distance to each of three-dimensional objects inside the imaging ranges 12111 to 12114; and a temporal change of the distance (a relative speed with respect to the vehicle 12100), and as a result thereof, the microcomputer 12051 can extract, particularly as a preceding vehicle, a closest three-dimensional object that exists on a traveling route of the vehicle 12100 and the three-dimensional object that travels in a direction substantially same as the vehicle 12100 at a predetermined speed (e.g., 0 km/h or more). Moreover, the microcomputer 12051 can preliminarily set an inter-vehicle distance to be secured in a front space with a preceding vehicle, and can perform automatic brake control (also including adaptive cruise stop control), automatic acceleration control (also including adaptive cruise start control), and the like. Thus, it is possible to perform cooperative control in order to perform automated cruise or the like in which autonomous travel is performed without depending on operation of a vehicle operator.

For example, the microcomputer 12051 extracts three-dimensional object data associated with a three-dimensional object in a manner categorized into a two-wheeled vehicle, a regular vehicle, a large vehicle, a pedestrian, and other three-dimensional objects such as a telephone pole on the basis of the distance information obtained from the imaging units 12101 to 12104, and can use the data to automatically avoid obstacles. For example, the microcomputer 12051 identifies whether an obstacle in the periphery of the vehicle 12100 is an obstacle that can be visible or an obstacle that can be hardly visible by a vehicle driver of the vehicle 12100. Then, the microcomputer 12051 determines a collision risk indicating a risk level of collision with each obstacle, and when the collision risk is a setting value or more and there is a possibility of collision, the microcomputer 12051 can provide operational assistance in order to avoid the collision by outputting an alarm to the vehicle driver via the audio speaker 12061 and the display unit 12062 or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is included in the captured images of the imaging units 12101 to 12104. Such pedestrian recognition is performed by, for example: a procedure of extracting feature points from the captured images of the imaging units 12101 to 12104 functioning as the infrared cameras; and a procedure of identifying whether or not an object is a pedestrian by applying pattern matching processing to a series of feature points indicating an outline of the object. When the microcomputer 12051 determines that a pedestrian is included in the captured images of the imaging units 12101 to 12104 and recognizes the pedestrian, the audio image output unit 12052 controls the display unit 12062 so as to display, for emphasis, a rectangular contour line over the recognized pedestrian in a superimposed manner. Furthermore, the audio image output unit 12052 may also control the display unit 12062 so as to display an icon or the like indicating the pedestrian at a desired position.

The exemplary vehicle control system to which the technology according to the present disclosure can be applied has been described above. The technology according to the present disclosure can be applied to the imaging unit 12031 among the configurations described above. Specifically, the imaging device 100 exemplified in FIG. 1 can be applied to the imaging unit 12031." and the like). With application of the technology according to the present disclosure to the imaging unit 12031, a glitch can be suppressed and a captured image has a clearer view, and therefore, fatigue of a vehicle driver can be reduced.

Note that the above-described embodiments are described as the examples to embody the present technology, and the matters recited in the embodiments and matters specifying the invention recited in the claims have corresponding relations, respectively. Similarly, the matters specifying the invention in the claims and the matters denoted by the same names in the embodiments of the present technology have corresponding relations, respectively. However, note that the present technology is not limited to the embodiments, and can be embodied by applying various modifications to the embodiments without departing from the gist thereof.

Furthermore, the processing procedures described in the above embodiments may be regarded as a method having a series of procedures, and also may be regarded as a program to cause a computer to execute the series of procedures or as a recording medium to store the program. As the recording medium, for example, a compact disc (CD), a mini disc (MD), a digital versatile disc (DVD), a memory card, a Blu-ray disc (Blu-ray (registered trademark) Disc), or the like can be used.

Note that the effects described in the present specification are merely the examples and not limited thereto, and further additional effects may also be provided.

Note that the present technology can also adopt the following configurations.

(1) A voltage conversion circuit including:

a conversion transistor that converts a potential of an input signal, the potential being changed from one of two different potentials to the other potential, by using predetermined current, and outputs the converted signal as an output signal;

a current source transistor that supplies the predetermined current to the conversion transistor; and a control circuit that stops supplying the predetermined current in a case where the potential of the input signal is changed to the other potential.

(2) The voltage conversion circuit recited in claim 1, in which the input signal is a signal having a potential changed from a higher potential out of two different power source potentials to a reference potential lower than the two power source potentials, and the control circuit stops supplying the predetermined current by a stop signal having a lower potential out of the two power source potentials.

(3) The voltage conversion circuit recited in (2) described above, in which the conversion transistor is an nMOS transistor, and the current source transistor is a pMOS transistor having breakdown voltage lower than breakdown voltage of the nMOS transistor.

(4) The voltage conversion circuit recited in any one of (1) to (3) described above, in which the current source transistor supplies the predetermined current in an initial state, and in a case where a predetermined reset signal is received, the control circuit shifts the current source transistor to the initial state.

(5) The voltage conversion circuit recited in any one of (1) to (4) described above, further including an enable control transistor that operates the conversion transistor in a case where a predetermined enable signal is received.

(6) The voltage conversion circuit recited in any one of (1) to (5) described above, further including a current control transistor that limits the predetermined current to a value less than a predetermined value.

(7) The voltage conversion circuit recited in any one of (1) to (5) described above, further including:

a capacitor inserted between a gate of the current source transistor and a power source potential;

a pair of pMOS transistors connected in series between the gate of the power source transistor and the power source potential; and a switch configured to supply a predetermined bias potential to the gate of the current source transistor in a case where a predetermined reset signal is received, in which the reset signal is received in one of gates of the pair of pSMOS transistors, and the other gate of the pair of pMOS transistors is connected to a connection node between the current source transistor and the conversion transistor.

(8) A solid-state imaging element including:

a comparator that compares a pixel signal with a predetermined reference signal and generates an input signal having a potential changed from one of two different potentials to the other potential on the basis of a result of the comparison;

a conversion transistor that converts the potential of the input signal by using predetermined current and outputs the converted signal as an output signal;

a current source transistor that supplies the predetermined current to the conversion transistor over a period until a predetermined stop signal is received; and a control circuit that stops supplying the predetermined current in a case where the potential of the input signal is changed to the other potential.

(9) The solid-state imaging element recited in (8) described above, in which the comparator is provided on a predetermined substrate, and the conversion transistor, the current source transistor, and the control circuit are provided on a substrate different from the predetermined substrate.

(10) The solid-state imaging element recited in (8) described above, in which the comparator and the conversion transistor are provided on a predetermined substrate, and the current source transistor and the control circuit are provided on a substrate different from the predetermined substrate.

(11) The solid-state imaging element recited in (8) described above, further including a pixel circuit that generates the pixel signal, in which the pixel circuit is provided on a predetermined substrate, and the comparator, the conversion transistor, the current source transistor, and the control circuit are provided on a substrate different from the predetermined substrate.

(12) The solid-state imaging element recited in (8) described above, further including a pixel circuit that generates the pixel signal, in which the pixel circuit is provided on a first substrate, the comparator is provided on a second substrate different from the first substrate, and the conversion transistor, the current source transistor, and the control circuit are provided on a third substrate different from the first and second substrates.

(13) The solid-state imaging element recited in (8) described above, further including a pixel circuit that generates the pixel signal, in which the pixel circuit is provided on a first substrate, the comparator and the conversion transistor are provided on a second substrate different from the first substrate, and the current source transistor and the control circuit are provided on a third substrate different from the first and second substrates.

(14) A method of controlling a voltage conversion circuit, including:

a conversion procedure of, by a conversion transistor, converting a potential of an input signal, the potential being changed from one of two different potentials to the other potential, by using predetermined current, and outputting the converted signal as an output signal;

a current supply procedure of, by a current source transistor, supplying the predetermined current to the conversion transistor; and a control procedure of, by a control circuit, stopping supplying the predetermined current in a case where the potential of the input signal is changed to the other potential.

REFERENCE SIGNS LIST

100 Imaging device
110 Imaging lens
120 Recording unit
130 Imaging control unit
200 Solid-state imaging element
201 Upper substrate
202 Intermediate substrate
203 Lower substrate
211 Vertical scanning circuit
212 Reference voltage source
213 Timing control unit
214 Horizontal scanning circuit
215 Pixel array unit
220 Pixel circuit
221 Photodiode
222 Transfer transistor
223 Reset transistor
224 Floating diffusion layer
225 Amplification transistor
226 Selection transistor
230 Comparison unit
240 Comparator
241 Differential amplifier circuit
242, 243, 252, 277, 277, 278, 281 pMOS transistor
244, 245, 253 Switch
246, 249, 254, 276 Capacitor
247, 248, 255, 280 nMOS transistor
250 Constant current source
251 Inverter circuit
260 Voltage conversion unit
270 Voltage conversion circuit
271 Current source transistor
272 Current control transistor
273 Conversion transistor
274 Enable control transistor
275 Negative OR (NOR) gate
279, 282 Inverter
285 Logic circuit
286 Logical product (AND) gate
290 Counting unit
291 Counter
292 Memory
295 Power source boundary circuit
12031 Imaging unit

The invention claimed is:

1. A voltage conversion circuit, comprising:
a conversion transistor configured to:
convert a potential of an input signal from a first potential to a second potential based on a specific current, wherein the second potential is different from the first potential; and
output the converted input signal as an output signal;
an enable control transistor configured to operate the conversion transistor based on reception of a specific enable signal;
a current source transistor configured to supply the specific current to the conversion transistor; and
a control circuit configured to stop supply of the specific current to the conversion transistor based on the conversion of the input signal from the first potential to the second potential.

2. The voltage conversion circuit according to claim 1, wherein
the potential of the input signal is converted from a higher potential out of two different power source potentials to a reference potential,
the reference potential is lower than each of the two different power source potentials, and
the control circuit is further configured to stop the supply of the specific current to the conversion transistor based on a stop signal having a lower potential out of the two different power source potentials.

3. The voltage conversion circuit according to claim 2, wherein
the conversion transistor includes an nMOS transistor, and
the current source transistor includes a pMOS transistor having a breakdown voltage lower than a breakdown voltage of the nMOS transistor.

4. The voltage conversion circuit according to claim 1, wherein
the current source transistor is further configured to supply the specific current to the conversion transistor in an initial state, and
the control circuit is further configured to shift the current source transistor to the initial state based on reception of a reset signal.

5. The voltage conversion circuit according to claim 1, further comprising
a current control transistor configured to limit a value of the specific current to less than a specific value.

6. The voltage conversion circuit according to claim 1, further comprising:
a capacitor inserted between a gate of the current source transistor and a power source potential;
a pair of pMOS transistors connected in series between the gate of the current source transistor and the power source potential; and
a switch configured to supply a specific bias potential to the gate of the current source transistor based on reception of a reset signal, wherein
the reset signal is received in a first gate of the pair of pMOS transistors, and
a second gate of the pair of pMOS transistors is connected to a connection node between the current source transistor and the conversion transistor.

7. A solid-state imaging element, comprising:
a comparator configured to:
compare a pixel signal with a reference signal; and
generate an input signal having a potential changed from a first potential to a second potential based on a result of the comparison, wherein the second potential is different from the first potential;
a conversion transistor configured to:
convert the potential of the input signal based on a specific current; and
output the converted input signal as an output signal;
a current source transistor configured to supply the specific current over a period until a stop signal is received; and
a control circuit configured to stop supply of the specific current to the conversion transistor based on the conversion of the input signal from the first potential to the second potential.

8. The solid-state imaging element according to claim 7, wherein
the comparator is on a first substrate, and
the conversion transistor, the current source transistor, and the control circuit are on a second substrate different from the first substrate.

9. The solid-state imaging element according to claim 7, wherein
the comparator and the conversion transistor are on a first substrate, and
the current source transistor and the control circuit are on a second substrate different from the first substrate.

10. The solid-state imaging element according to claim 7, further comprising
a pixel circuit configured to generate the pixel signal, wherein
the pixel circuit is on a first substrate, and
the comparator, the conversion transistor, the current source transistor, and the control circuit are on a second substrate different from the first substrate.

11. The solid-state imaging element according to claim 7, further comprising
a pixel circuit configured to generate the pixel signal, wherein
the pixel circuit is on a first substrate,
the comparator is on a second substrate different from the first substrate, and
the conversion transistor, the current source transistor, and the control circuit are on a third substrate different from each of the first substrate and the second substrate.

12. The solid-state imaging element according to claim 7, further comprising
a pixel circuit configured to generate the pixel signal, wherein
the pixel circuit is on a first substrate,
the comparator and the conversion transistor are on a second substrate different from the first substrate, and
the current source transistor and the control circuit are on a third substrate different from each of the first substrate and the second substrate.

13. A method of controlling a voltage conversion circuit, comprising:
converting, by a conversion transistor, a potential of an input signal from a first potential to a second potential based on a specific current, wherein the second potential is different from the first potential;
outputting, by the conversion transistor, the converted input signal as an output signal;
operating, by an enable control transistor, the conversion transistor based on reception of a specific enable signal;
supplying, by a current source transistor, the specific current to the conversion transistor; and
stopping, by a control circuit, supply of the specific current to the conversion transistor based on the conversion of the input signal from the first potential to the second potential.

14. A voltage conversion circuit, comprising:
a conversion transistor configured to:
convert a potential of an input signal from a first potential to a second potential based on a specific current, wherein the second potential is different from the first potential; and
output the converted input signal as an output signal;
a current source transistor configured to supply the specific current to the conversion transistor in an initial state; and
a control circuit configured to:
stop supply of the specific current to the conversion transistor based on the conversion of the input signal from the first potential to the second potential; and
shift the current source transistor to the initial state based on reception of a specific reset signal.

* * * * *